United States Patent
Enomoto et al.

(10) Patent No.: US 9,040,343 B2
(45) Date of Patent: May 26, 2015

(54) SOLID-STATE IMAGING DEVICE, METHOD OF MANUFACTURING SOLID-STATE IMAGING DEVICE, AND ELECTRONIC APPARATUS

(71) Applicant: Sony Corporation, Tokyo (JP)

(72) Inventors: Takayuki Enomoto, Kanagawa (JP); Hideaki Togashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 60 days.

(21) Appl. No.: 14/088,978

(22) Filed: Nov. 25, 2013

(65) Prior Publication Data
US 2014/0080252 A1    Mar. 20, 2014

Related U.S. Application Data

(62) Division of application No. 13/249,825, filed on Sep. 30, 2011, now Pat. No. 8,624,306.

(30) Foreign Application Priority Data

Oct. 7, 2010    (JP) .................................. 2010-227757

(51) Int. Cl.
*H01L 21/00*    (2006.01)
*H01L 27/146*   (2006.01)

(52) U.S. Cl.
CPC .... *H01L 27/14689* (2013.01); *H01L 27/14614* (2013.01); *H01L 27/14621* (2013.01); *H01L 27/14623* (2013.01); *H01L 27/14627* (2013.01); *H01L 27/1464* (2013.01)

(58) Field of Classification Search
CPC ................................... H01L 27/14689
USPC .......................................... 438/98
See application file for complete search history.

(56) References Cited

U.S. PATENT DOCUMENTS

| 7,541,627 B2 | 6/2009 | Hynecek et al. |
| 7,821,090 B2 | 10/2010 | Akiyoshi |
| 2009/0189235 A1 | 7/2009 | Ikeda et al. |

FOREIGN PATENT DOCUMENTS

| JP | 06-283702 | 10/1994 |
| JP | 2004-281499 | 10/2004 |
| JP | 2007-531254 | 11/2007 |
| JP | 2008-258316 | 10/2008 |

*Primary Examiner* — Matthew Reames
(74) *Attorney, Agent, or Firm* — Dentons US LLP

(57) ABSTRACT

A solid-state imaging device including a substrate, a through-hole, a vertical gate electrode, and a charge fixing film. A photoelectric conversion unit generating signal charges in accordance with the amount of received light is formed in the substrate. The through-hole is formed from a front surface side through a rear surface side of the substrate. The vertical gate electrode is formed through a gate insulating film in the through-hole and reads out the signal charges generated by the photoelectric conversion unit to a reading-out portion. The charge fixing film has negative fixed charges formed to cover a portion of the inner circumferential surface of the through-hole at the rear surface side of the substrate while covering the rear surface side of the substrate.

14 Claims, 19 Drawing Sheets

SOLID-STATE IMAGING DEVICE, METHOD OF MANUFACTURING SOLID-STATE IMAGING DEVICE, AND ELECTRONIC APPARATUS

RELATED APPLICATION DATA

This application is a division of U.S. patent application Ser. No. 13/249,825 filed Sep. 30, 2011, the entirety of which is incorporated herein by reference to the extent permitted by law. The present application claims the benefit of priority to Japanese Patent Application No. JP 2010-227757 filed on Oct. 7, 2010 in the Japan Patent Office, the entirety of which is incorporated by reference herein to the extent permitted by law.

BACKGROUND

The present disclosure relates to a rear radiation type solid-state imaging device, a method of manufacturing the solid-state imaging device, and an electronic apparatus using the solid-state imaging device.

In the related art, a CCD type solid-state imaging device and a CMOS type solid-state imaging device have been proposed as solid-state imaging devices that are used in digital cameras or video cameras. In such solid-state imaging devices, a light receiving section is formed in each of a plurality of pixels formed in a two-dimensional matrix and a signal charge is generated in the light receiving section in accordance with the amount of light received. Further, the signal charge generated in the light receiving section is transferred and amplified, thereby acquiring an image signal.

Common solid-state imaging devices of the related art are surface type solid-state imaging devices that are equipped with a substrate with electrodes or wires on the surface and radiate light from above. For example, in surface type and CMOS type solid-state imaging devices, photodiodes (PD) of the light receiving sections of the pixels are formed inside the silicon substrate and a plurality of wire layers are formed on the silicon substrate through an interlayer insulating film. Further, a color filter and an on-chip lens are disposed above the wire layers. In the surface type solid-state imaging device, light travels into the photodiodes of the light receiving section through the color filter and the wire layers from the on-chip lens.

However, there is a problem in that as the solid-state imaging device is miniaturized, the pitches of the wires decrease while the wire layers become multi-layered, such that the distances between the light receiving sections on the on-chip lens and the silicon substrate increase. With the multi-layering of the wire layers, a portion of incident light traveling at an angle is blocked by the wire layers and does not easily reach the light receiving sections on the silicon substrate, such that a phenomenon, such as shading, occurs.

Recently, a rear radiation type solid-state imaging device that radiates light from a side opposite to the side where the wire layers are formed on the substrate has been proposed (see Japanese Unexamined Patent Application Publication No. 6-283702). In the rear radiation type solid-state imaging device, since a wire layer or a circuit device is not disposed at the side from which light is radiated, it is possible to achieve an effective aperture ratio of 100% of a light receiving section formed on a substrate whereby incident light travels into the light receiving section without reflecting from a wire layer. Therefore, there are great expectations of considerably improving sensitivity and eliminating shading in the rear radiation type solid-state imaging device.

In the rear radiation type solid-state imaging device, it may be preferable to improve the maximum cumulative dosage (Quantity of saturated charges; Qs) of photoelectric-converted charge in the photodiode or widen the area of the photodiode in the depth direction of the substrate, in order to improve the dynamic range, which is the basic performance. However, when the photodiode is expanded close to the light receiving surface, the distance from the output terminal increases, such that it is difficult to completely transfer the charges accumulated in the photodiode, which causes a residual image. As an improvement plan, a solid-state imaging device equipped with a vertical transistor having a reading electrode (trench type electrode) corresponding to a photodiode has been proposed (see Japanese Unexamined Patent Application Publication No. 2004-281499 and PCT Japanese Translation Patent Publication No. 2007-531254).

FIG. 19 shows a schematic cross-sectional configuration of a solid-state imaging device equipped with a vertical transistor of the related art. As shown in FIG. 19, two layers of photodiodes PD1 and PD2 are formed in the depth direction of a substrate 101. Vertical gate electrodes 103 and 104 are formed deep in contact with the photodiodes PD1 and PD2, respectively. The vertical gate electrodes 103 and 104 are formed by embedding an electrode material in trench portions formed in desired depths in the substrate 101 through a gate insulating film 102. Floating diffusion portions FD1 and FD2 are formed at the areas adjacent to the vertical gate electrodes 103 and 104, respectively.

In the solid-state imaging device 100 of FIG. 19, signal charges accumulated in the photodiodes PD1 and PD2 are transferred to the floating diffusion portions FD1 and FD2, respectively, by applying a desired voltage to the vertical gate electrodes 103 and 104. In this configuration, it is possible to implement a configuration that can transfer signal charges accumulated in the photodiodes PD1 and PD2 formed in different depths by changing the depths of the trench portions formed on the substrate 10. However, the configuration that changes the depths of the trench portions in the same substrate is difficult implement by a one-time lithography process and etching process, such that it is necessary to repeat the process of forming the vertical gate electrodes 103 and 104 several times. Therefore, considering non-uniformity of the depths of the trench portions or non-uniformity of the process, such as non-uniformity in diffusion of ion injection when forming the photodiodes, it is not practical to design a pixel that can transfer a photoelectric-converted signal charge.

It may be considered to remove the process non-uniformity by applying a vertical transistor composed of vertical gate electrodes formed through a substrate (see Japanese Unexamined Patent Application Publication No. 2008-258316).

FIG. 20 shows a schematic cross-sectional configuration of a solid-state imaging device 105 including a vertical gate electrode formed through a substrate. As shown in FIG. 20, a solid-state imaging device 105 includes a vertical gate electrode 108 that is vertically formed through the horizontal surface of a substrate 106. The vertical gate electrode 108 is formed by forming a through-hole through the substrate 106 and embedding an electrode material through a gate insulating film 107. In the solid-state imaging device 107 of FIG. 20, a signal charge of a photodiode PD formed deep in the depth direction of the substrate 106 can be read out with a floating diffusion portion FD formed opposite to a light receiving side of the substrate 106.

However, when the vertical gate electrode 108 is formed through the substrate 106 shown in FIG. 20, the deep portion of the substrate 106 is damaged by backflow of an etchant when forming the through-hole from the surface side to the rear surface side of the substrate 106. Accordingly, there is a problem on the rear surface side of the substrate 106 in that a carrier is generated at the corners (surrounded by dotted lines 'a') continuing from the inner circumferential surface of the end of the through-hole to the rear surface side of the substrate, and a noise is generated by the mixing of the carrier with a carrier (signal) created by photoelectric conversion, such that so-called white points increase.

SUMMARY

It is desirable to provide a solid-state imaging device with the generation of white points reduced due to the reduction of process non-uniformity. Further, it is desirable to provide an electric device using the solid-state imaging device. A solid-state imaging device according to an embodiment of the present disclosure includes a substrate, a through-hole formed through the substrate, a vertical gate electrode formed in the through-hole, and a charge fixing film.

A photoelectric conversion unit generating signal charges in accordance with the amount of received light is formed in the substrate. The through-hole is formed from a front surface side through a rear surface side of the substrate. The vertical gate electrode causes a reading-out portion to read out the signal charges generated by the photoelectric conversion unit and is formed through a gate insulating film in the through-hole. The charge fixing film is implemented by a film that is formed to cover a portion of the inner circumferential surface of the through-hole at the rear surface side of the substrate while covering the rear surface side of the substrate and has negative fixed charges.

In the solid-state imaging device according to the embodiment of the disclosure, it is possible to cause a charge reading-out portion formed at the surface side to read out the signal charges accumulated at a deep position, at the center portion of the photoelectric conversion unit formed in the depth direction of the substrate, by forming a vertical gate electrode in the through-hole. Further, the rear surface side of the substrate and a portion of the inner circumferential surface of the through-hole are coated with the charge fixing film that is implemented by a film having negative fixed charges. Therefore, it is possible to restrain dark current from being generated at the rear surface side of the substrate while absorbing carriers due to a defect of the substrate which is generated at a deep position of the through-hole with the charge fixing film.

A method of manufacturing a solid-state imaging device according to another embodiment of the disclosure first forms a hole at a desired depth across the rear surface side from the surface of a substrate. Next, a vertical gate electrode that causes a reading-out portion formed at the surface side of the substrate to read out the signal charges accumulated in the photoelectric conversion unit by embedding an electrode material into the hole through a gate insulating film is formed. Next, a wire layer where a plurality of layers of wires is stacked is formed on the surface of the substrate through an interlayer insulating film. Next, the substrate is turned over after bonding a support substrate onto the wire layer. Next, the gate insulating film formed in the through-hole at a predetermined depth is removed while forming the through-hole by reducing the thickness of the substrate until the hole passes through the rear surface side of the substrate. Next, a charge fixing film having negative fixed charges covering the entire rear surface of the substrate is formed while filling the through-hole with the gate insulating film removed.

In the method of manufacturing a solid-state imaging device according to the embodiment of the disclosure, the bottom of a hole formed at the substrate passes the rear surface side of the substrate and becomes a through-hole by reducing the size of the substrate. Further, the gate insulating film formed in the through-hole is removed at a predetermined depth and the charge fixing film having negative fixed charges is embedded in the removed portion. Therefore, since the inner circumferential surface of the through-hole at the rear surface side of the substrate is coated with the charge fixing film, abnormal carriers due to a defect of the substrate which is generated at the bottom of the hole when forming the hole are absorbed into the charge fixing film and white points can be prevented from being generated. Further, the charge fixing film is formed throughout the rear surface of the substrate. Therefore, dark current that is generated at the interface of the substrate is restrained.

An electronic apparatus according to still another embodiment of the present disclosure includes an optical lens, a solid-state imaging device into which light condensed in the optical lens travels, and a signal processing circuit that processes an output signal that is output from the solid-state imaging device. Further, the solid-state imaging device includes a substrate, a through-hole formed through the substrate, a vertical gate electrode formed in the through-hole, and a charge fixing film. A photoelectric conversion unit generating signal charges in accordance with the amount of received light is formed in the substrate. The through-hole is formed through the rear surface side from the surface of the substrate. The vertical gate electrode causes a reading-out portion to read out the signal charges generated by the photoelectric conversion unit and is formed through a gate insulating film in the through-hole. The charge fixing film is implemented by a film that is formed to cover a portion of the inner circumferential surface of the through-hole at the rear surface side of the substrate while coating the rear surface side of the substrate and has negative fixed charges.

According to the embodiment of the present disclosure, non-uniformity in processes is reduced and white points are prevented from being generated, in a rear side radiation type solid-state imaging device that increases the quantity of saturated charges. Further, an electronic apparatus that improves image quality is achieved by using the solid-state imaging device.

DETAILED DESCRIPTION OF EMBODIMENTS

Hereinafter, solid-state imaging devices according to embodiments of the present disclosure and an example of an electronic apparatus are described with reference to FIGS. 1 to 18. The embodiments of the present disclosure are described in the following order. Further, the present disclosure is not limited to the following examples.

1. First Embodiment: Example of a CMOS Type and Rear Radiation Type Solid-state Imaging Device
  1-1. Entire Configuration
  1-2. Configuration of Main Part
  1-3. Manufacturing Method (Example Using Bulk Substrate)
2. Second Embodiment: Example of Method of Manufacturing Rear Radiation Type CMOS Solid-state imaging device (Example Using SOI Substrate)
3. Third Embodiment: Example of Rear Radiation Type CMOS Solid-state imaging device (Example Using SOI Substrate)
  3-1. Cross-Sectional Configuration of Main Part
  3-2. Manufacturing Method
4. Fourth Embodiment: Example of Rear Radiation Type CMOS Solid-state imaging device (Example of Vertical Light Dispersion)
5. Fifth Embodiment: Example of Rear Radiation Type CMOS Solid-state Imaging Device (Example of Vertical Light Dispersion)
6. Sixth Embodiment: Electronic Apparatus 1. First Embodiment A solid-state imaging device according to a first embodiment of the present disclosure is described. The embodiment exemplifies a rear radiation type CMOS solid-state imaging device.

1-1. Entire Configuration

Figure 1:
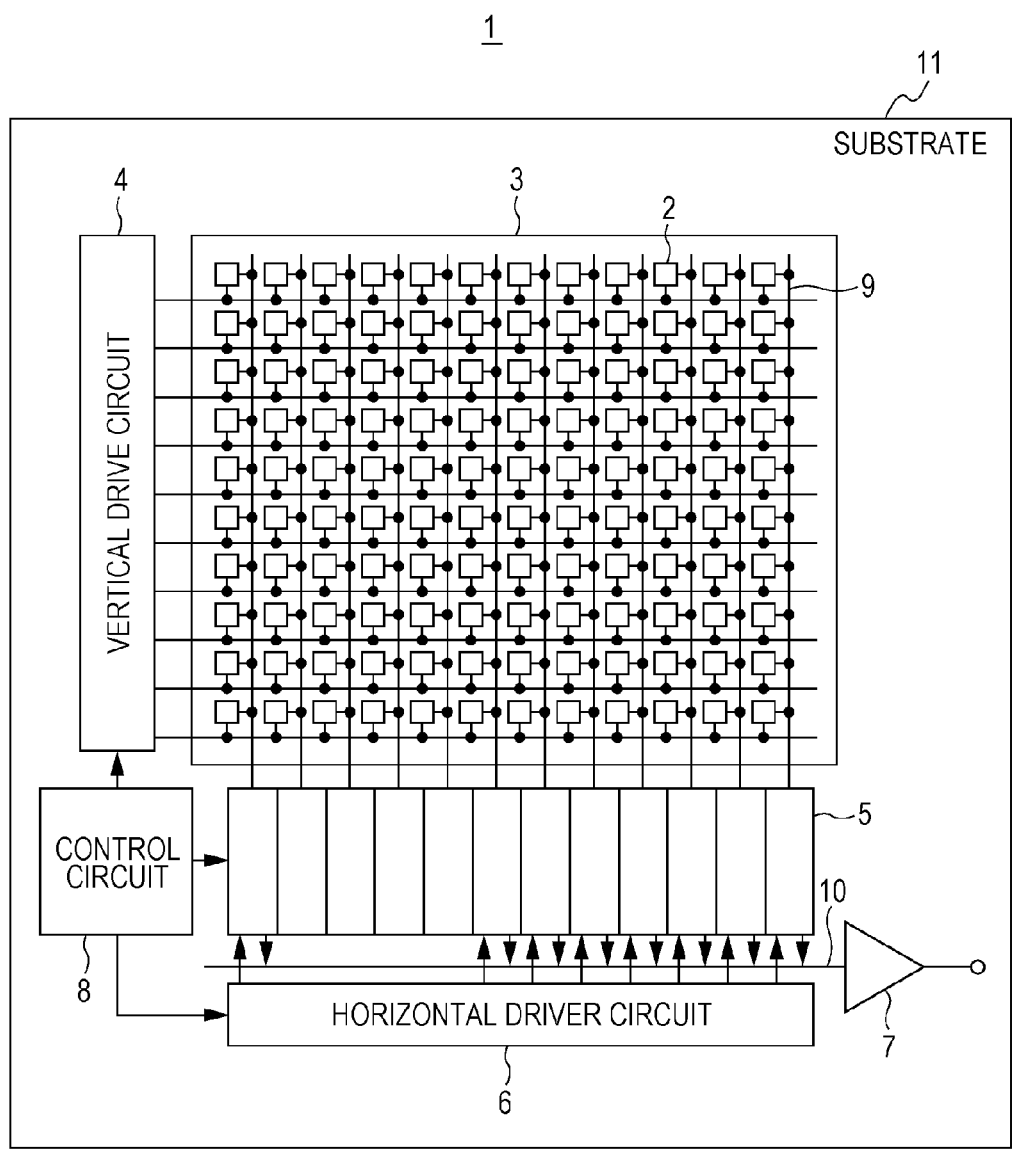
FIG. 1 is a schematic configuration view showing the entirety of a solid-state imaging device according to a first embodiment of the present disclosure.

First, the entire configuration of a solid-state imaging device according to the embodiment is described before describing of the configuration of the main part. FIG. 1 is a schematic configuration view showing the entire of a solid-state imaging device according to the embodiment.

A solid-state imaging device 1, as shown in FIG. 1, includes an imaging area 3 composed of a plurality of pixels 2, a vertical driving circuit 4, a column signal process circuit 5, a horizontal driving circuit 6, an output circuit 7, and a control circuit 8, on a substrate 11 made of silicon.

The pixels 2 are each composed of a light receiving section that is a photodiode generating a signal charge in accordance with the amount of received light and a plurality of MOS transistors that reads out and transfers the signal charge, and are regularly arranged in a 2-dimensional array on the substrate 11.

The imaging area 3 is composed of a plurality of pixels 2 regularly arranged in a 2-dimensional array. The imaging area 3 is composed of an effective pixel area that can accumulate a signal charge generated by photoelectric conversion of light that is actually received and a non-effective pixel area (hereafter, referred to as optical black area) that is formed around the effective pixel area and outputs optical black that is the reference of a black level.

The control circuit 8 generates clock signals and controls signals that are the references of operations of the vertical driving circuit 4, the column signal process circuit 5, and the horizontal driving circuit 6, on the basis of a vertical synchronization signal, a horizontal synchronization signal, and a master clock signal. Further, the clock signals or the control signals generated from the control signal 8 are input to the vertical driving circuit 4, the column signal process circuit 5, and the horizontal driving circuit 6.

The vertical driving circuit 4 is, for example, implemented by a shift register, and vertically scans the pixels 2 in the imaging area 3 sequentially according to the lines. Further, a pixel signal based on the signal charge generated from the photoelectric conversion element of the pixel 2 is supplied to the signal process circuit 5 through a vertical signal line 9.

The column signal process circuit 5 is disposed in each line of the pixels 2 and, for example, processes the signals output from the pixels 2 in one column by a signal from the optical black area (formed around the effective pixel area, though not shown) for each pixel line, such as removal of noises or amplification of signals.

A horizontal selection switch (not shown) is disposed between an output terminal of the column signal process circuit 5 and a horizontal signal line 10.

The horizontal driving circuit 6 is, for example, implemented by a shift register and sequentially selects the column signal process circuits 5 and outputs pixel signals from the column signal process circuits 5 to the horizontal signal line 10 by sequentially outputting horizontal scanning pulses.

The output circuit 7 processes and outputs pixel signals sequentially supplied through the horizontal signal line 10 from the column signal process circuit 5.

1-2. Configuration of Main Part

Figure 2:
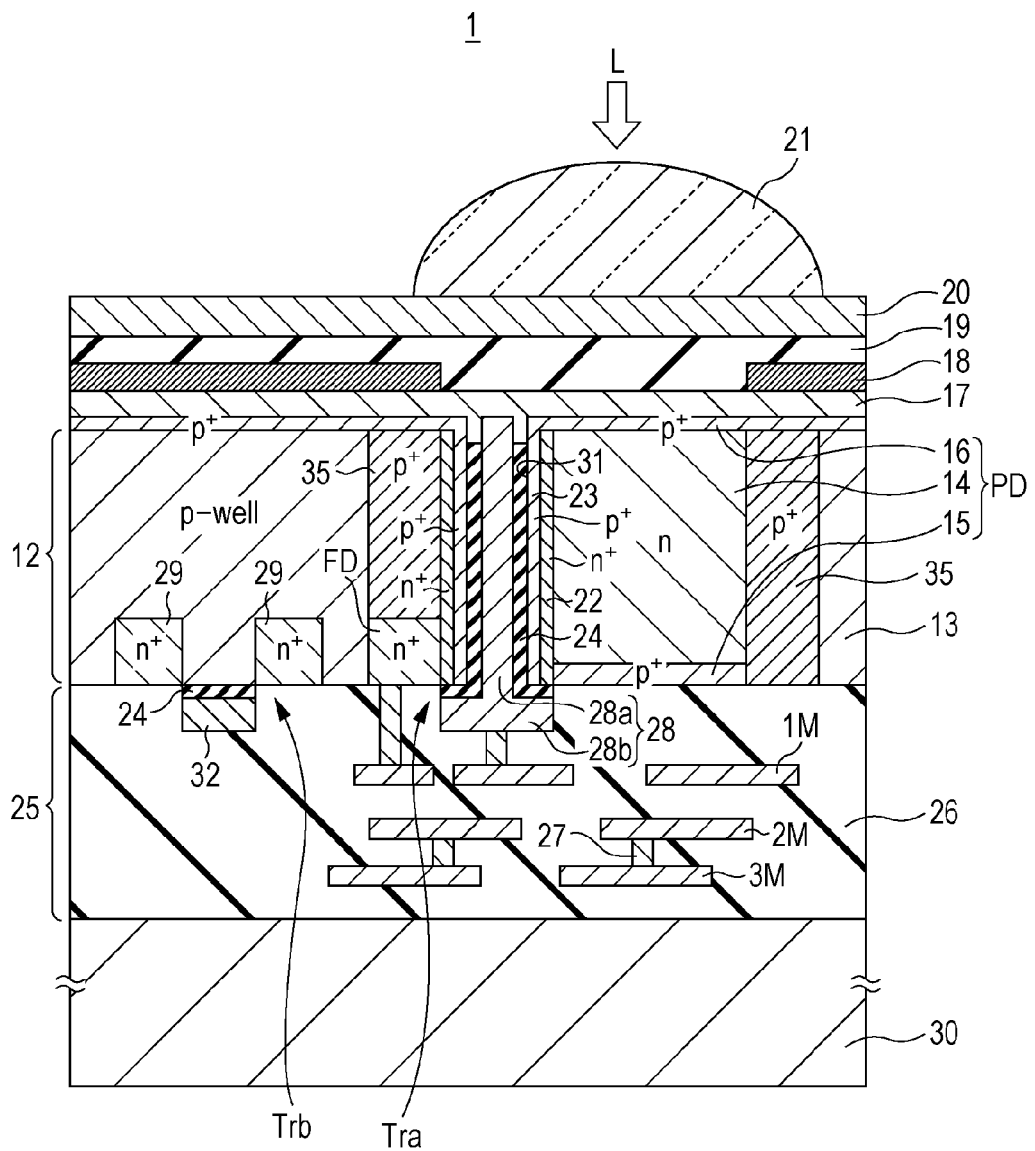
FIG. 2 is a schematic cross-sectional configuration view showing the main part of the solid-state imaging device according to the first embodiment of the present disclosure.

FIG. 2 is a cross-sectional configuration view of the main part of the solid-state imaging device according to the embodiment. The solid-state imaging device 1 according to the embodiment includes a plurality of photoelectric conversion units, a substrate 12 where pixel transistors including a vertical transistor Tra and a surface type transistor Trb are formed, a wire layer 25, and a support substrate 30. Further, a charge fixing layer 17, a light shield film 18, a planarizing film 19, a color filter layer 20, and an on-chip lens 21 are provided on the rear surface side of the substrate 12.

The substrate 12 is implemented by a semiconductor substrate made of a first conduction type silicon (n-type in the embodiment) and a second conduction type well area 13 (p-type in the embodiment) is formed in a predetermined area of the substrate 12. A plurality of pixels that is each composed of a photoelectric conversion unit implemented by a photodiode PD and a plurality of pixel transistors are formed in a 2-dimensional matrix in the well area 13 of the substrate 12. In the embodiment, the rear surface side of the substrate 12 is a light receiving surface and the surface side of the substrate 12 is a circuit forming surface where a reading-out circuit is formed. That is, in the embodiment, light travels inside through the rear surface side of the substrate 12.

The photodiode PD of the photoelectric conversion unit is composed of p-type semiconductor areas 15 and 16 that restrain dark current generated at the surface side and the rear surface side of the substrate 12 and an n-type semiconductor area 14 that is a charge accumulation area formed between the p-type semiconductor areas 15 and 16. The p-type semiconductor areas 15 and 16 that restrain dark current are formed with higher density than the concentration of an impurity of the well area 13. In the embodiment, the main photodiode PD is formed by pn-bonding implemented on the bonding surface of the p-type semiconductor areas 15 and 16 and the n-type semiconductor area 14 that defines the charge accumulation area.

A signal charge according to the amount of light traveling into the substrate 12 is generated and accumulated in the n-type semiconductor area 14 that is the charge accumulation area, in the photodiode PD. Further, electrons that cause the dark current generated on the interface of the substrate 12 are absorbed into holes, which are a plurality of carriers of the p-type semiconductor areas 15 and 16, thereby restraining the dark current.

Further, the photodiode PD is surrounded by a pixel separation area that is defined by the high-density p-type semiconductor area 35. Therefore, it is possible to prevent the signal charges, which are generated from the photodiode PD and accumulated, from moving to another pixel.

The pixel transistor of a unit pixel is implemented by an n-channel MOS transistor and composed of three transistors, a transfer transistor, a reset transistor, and an amplification transistor, or four transistors, including a selection transistor. The transfer transistor is implemented by a vertical transistor Tra while the other transistors are implemented by surface type transistors Trb. One vertical transistor Tra for the transfer transistor, and one surface type transistor Trb of any one for the reset transistor, the amplification transistor, or the selection transistor are shown in FIG. 2.

The vertical transistor Tra is composed of a vertical gate electrode 28 disposed adjacent to the photodiode PD and a floating diffusion area FD that is a charge reading-out portion, formed on the rear surface side of the substrate 12 which is adjacent to the vertical gate electrode 28. The vertical gate electrode 28 is composed of an embedded portion 28a formed in a through-hole 31 formed through the substrate 12 and an extending portion 28b that extends to the surface side of the substrate. The embedded portion 28a is longitudinally formed with respect to the horizontal surface of the substrate 12, by embedding an electrode material in the through-hole 31 through a gate insulating film 24. Further, the extending portion 28b is formed through the gate insulating film 24 on the surface of the substrate 12, connected to the embedded portion 28a. Further, the vertical gate electrode 28 is formed, with the embedded portion 28a in contact with the n-type semiconductor area 14 that is a charge accumulation area. The through-hole 31 is open vertically through the horizontal surface of the substrate 12 and the inner circumferential surface of the through-hole 31 at the end portion of the rear surface side of the substrate 12 is covered with a charge fixing film 17, which is described below. The floating diffusion area FD is formed at the rear surface side of the substrate 12 and defined by an n-type semiconductor area having higher density than the n-type semiconductor area 14 of the charge accumulation area.

Further, a channel-formed layer 22 is formed along the vertical gate electrode 28 from the photodiode PD to the floating diffusion area FD of the substrate 12, in the vertical transistor Tra. The channel-formed layer 22 is formed in the n-type semiconductor area having higher density than the n-type semiconductor area 14 of the charge accumulation area. Further, a p-type semiconductor area 23 is formed in the area between the vertical gate electrode 28 and the channel-formed layer 22. The p-type semiconductor area 23 has a function of removing the dark current generated from the interface of the through-hole 31 or the electrons that cause white points by re-bonding the electrons to the holes that are a plurality of carriers of the p-type semiconductor area.

A channel is formed on the channel-formed layer 22 by applying a desired voltage to the vertical gate electrode 28, in the vertical transistor Tra. Accordingly, the signal charges accumulated in the n-type semiconductor area 14 that is the charge accumulation area are effectively transferred to the floating diffusion area FD through the channel formed along the vertical gate electrode 28.

The surface type transistor Trb is composed of source/drain areas 29 and a surface type gate electrode 32 formed between the source/drain areas 29. The source/drain areas 29 are implemented by n-type semiconductor areas having higher density than, for example, the n-type semiconductor area 14 that is a charge accumulation area, formed at the surface side of the substrate 12. The source/drain areas 29 of the surface type transistor Trb for the reset transistor, the amplification transistor, or the selection transistor are implemented mutually with the desired source/drain areas of another surface type transistor. The signal charge read out from the floating diffusion area FD by the vertical transistor Tra is output to a signal wire formed on the sire layer 25, as a pixel signal, through the surface type transistor Trb.

Insulating materials, such as a silicon oxide film, a silicon nitride film, a high-dielectric film (High-k film), or a film having negative fixed charges, may be used as the material of the gate insulating film.

As the high-dielectric film, hafnium oxide ($HfO_2$), tantalum oxide ($Ta_2O_5$), zirconium oxide ($ZrO_2$), praseodymium oxide (PrOx), titanium dioxide ($TiO_2$), hafnia silicate (HfSiO), yttrium oxide ($Y_2O_3$), nitrogenized hafnium aluminate (HfAlON) or the like may be used.

As the film having negative fixing charges, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium dioxide ($TiO_2$) film may be used. As method of forming the film, for example, chemical vapor deposition, spattering, and atomic layer vapor deposition may be used. When the atomic layer vapor deposition is used, it is very suitable for simultaneously forming a $SiO_2$ film having about a 1 nm thickness that reduces the interface state while forming the film. Further, as a material other than the materials described above, lanthanum oxide ($La_2O_3$), praseodymium oxide ($Pr_2O_3$), cerium oxide ($CeO_2$), neodymium oxide ($Nd_2O_3$), promethium oxide ($Pm_2O_3$) or the like may be used. Further, as the materials, samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), or the like may be used. Further, as the material, holmium oxide ($HO_2O_3$), thulium oxide ($Tm_2O_3$), ytterbium oxide ($Yb_2O_3$), lutetium oxide ($Lu_2O_3$), yttrium oxide ($Y_2O_3$), or the like may be used. Further, the film having negative fixed charges may be a hafnium nitride film, an aluminum nitride film, a hafnium oxynitride film, or an aluminum oxynitride film.

Further, silicon (Si) or nitrogen (N) may be added to the films within a range that does not deteriorate insulation, as the film having negative fixed charges. The concentration is appropriately determined within a range that does not deteriorate insulation of the film. It is possible to increase thermal resistance of the film or the performance of ion injection prevention in a process by adding silicon (Si) or nitrogen (N) as described above.

Transfer efficiency is deteriorated when a high-dielectric film or a film having negative fixed charges is used as the gate insulating film 24, and there is an advantage in that the process can be shortened as compared with when a silicon-based insulating material is used. In the embodiment, an example of using a silicon oxide film as the gate insulating film 24 is described.

A conductive material, such as polysilicon, phosphorous doped amorphous silicon (PDAS), or metal may be used as the material of the vertical gate electrode 28 and the surface type gate electrode 32, and may be selected, according to the material of the gate insulating material. For example, when a silicon oxide film, a silicon nitride film, or a film having negative fixed charges is used, polysilicon, PDAS or the like is used, when a High-K film is used, polysilicon, PDAS, metal or the like is used. Further, whether to use polysilicon or PDAS depends on the manufacturing process. Further, polysilicon or PDAS may be used for the High-K film, but high performance may not be achieved for a work function.

The wire layer 25 is formed at the surface side opposite to the light incidence side of the substrate 12 and composed of a plurality of wires 1M to 3M stacked in a plurality of layers (three layers in FIG. 2) through the interlayer insulating film 26. The desired wires or the wires 1M to 3M and the pixel transistor implemented by the vertical transistor Tra or the surface type transistor Trb are connected by a contact portion 27. Accordingly, the pixel transistors of the pixels are driven from the wire layer 25. As the material of the wires 1M to 3M of the wire layer 25, a metal material, such as aluminum (Al) or copper (Cu) may be used. Further, as the material of the contact portion 27, a metal material, such as tungsten or copper, may be used.

The support substrate 30 is implemented, for example, by a silicon substrate, and bonded on the wire layer 25. The support substrate 30 is bonded on the wire layer in the manufacturing process and provided to improve the strength of the substrate 12.

The charge fixing film 17 is made of a material having negative fixed charges and formed throughout the rear surface that is the light incidence side of the substrate 12. Further, the charge fixing film 17 is embedded at a predetermined depth in the through-hole 31 to coat the inner circumferential surface of the end of the through-hole 31 at the rear surface side of the substrate 12 while being formed at the rear surface side of the substrate 12. Since the charge fixing film 17 is made of a material having negative fixed charges, the hole accumulation state is strengthened at the corner of the substrate 12, including the inner circumferential surface of the end of the through-hole 31 and the rear surface side of the substrate 12. Therefore, dark current that is generated at the interface of the substrate is restrained and dark current that is abnormally generated by a defect generated at the inner circumferential surface of the end of the through-hole 31 or at the corner of the substrate 12 is restrained.

The charge fixing film 17 may be made of the same material as the film having negative fixed charges that can be used for the gate insulating film 24. The charge fixing film 17 is a film provided to prevent dark current that is generated at the rear surface side of the substrate 12 and at the inner circumferential surface of the end of the through-hole 31 at the rear surface side of the substrate 12 and is preferably made of a material that can achieve a strong pinning effect.

It is preferable that the embedded depth in the through-hole 31 of the charge fixing film 17, that is, the depth from the rear surface of the substrate 12 of the charge fixing film 17 formed in the through-hole 31 is determined in order not to cross the channel formed adjacent to the n-type semiconductor area 14 of the charge accumulation area. When charges are transferred by applying a desired voltage to the vertical gate electrode 28, a hole is excited in the area adjacent to the charge fixing film 17, such that an n-type channel is not easily formed on the channel-formed layer 22.

Therefore, the formed area in the through-hole 31 of the charge fixing film 17 is determined such that a channel that is necessary for transferring charges is formed in the depth direction of the substrate 12. Further, it is preferable that the embedded depth in the through-hole 31 of the charge fixing film 17 is 5 nm or more to appropriately restrain dark current that is generated at the end of the vertical gate electrode 28 or at the corner of the substrate 12. However, the regulation of the depth of the charge fixing film 17 is not limited thereto when the gate insulating film 24 is implemented by a film having negative fixed charges.

Further, the charge fixing film 17 may be implemented by a stacked layer formed by a plurality of kinds of films having negative fixed charges. Further, though not shown, an insulating film, such as a silicon oxide film, a silicon nitride layer, or a high-dielectric film (High-k film), may be stacked on the charge fixing film 17. It is possible to achieve an antireflection coating effect of by stacking an insulating film, such as an oxide film or a nitride film which has a refraction index different from the refraction index of the charge fixing film 17.

The light shield film 18 is formed at the light incidence side on the charge fixing film 17 and open at the area where the photodiodes PD of the pixels such that the other portion is shielded from light. The light shield film 18, for example, is implemented by a metal film having a light blocking effect. It is possible to prevent incident light traveling at an angle from traveling into an adjacent pixel by forming the light shield film 18, such that mixing of colors decreases.

The planarizing film 19 is formed on the charge fixing film 17 including the light shield film 18 to cover a step generated by the light shield film 18 and the surface is planarized. The planarizing film 19 is made of, for example, a coating-typed insulating material.

The color filter layer 20 is formed on the planarizing film 19, corresponding to each of the pixels. The color filter layer 20 selectively transmits light, such as green, red, blue, cyan, yellow, black, or white light, for the pixels. Color filter layers 20 that transmit different colors may be used for the pixels or a color filter layer 20 that transmits the same color may be used for all of the pixels. Combination of colors of the color filter layer 20 may be selected in various ways, depending on the specifications.

The chip-on lens 21 is formed on the color filter layer 20, corresponding to each of the pixels. Incident light is condensed by the chip-on lens 21 and efficiently travels into the photodiodes PD of the pixels 2. As the material of the chip-on lens 21, for example, a material having a refraction index of 1.0 to 1.3 may be used.

1-3. Manufacturing Method

Next, a method of a solid-state imaging device according to the embodiment is described. FIGS. 3 to 7 are views showing the manufacturing process of the solid-state imaging device 1 according to the embodiment. Further, in the description of the manufacturing method, an example of using a silicon oxide film as the gate insulating film is described.

Figure 3A:
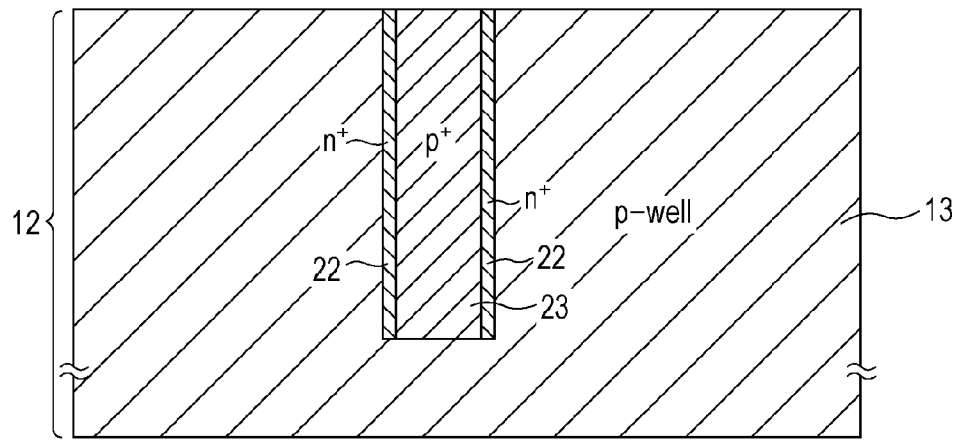
FIGS. 3A, 3B, and 3C are process diagrams (1 to 3) showing a method of manufacturing the solid-state imaging device according to the first embodiment of the present disclosure.

First, as shown in FIG. 3A, the p-type well area 13 is formed by ion-injecting a p-type impurity in the surface side of the substrate 12 implemented by an n-type semiconductor. Thereafter, the p-type semiconductor area 23 is formed by ion injection at a depth that is the same as or slightly larger than the depth of the formed through-hole 31 which is an area wider than the diameter of the through-hole 31 formed in the area where the through-hole 31 is formed. Further, the channel-formed layer 22 is formed by ion-injecting an n-type impurity around the p-type semiconductor area 23.

Figure 3B:
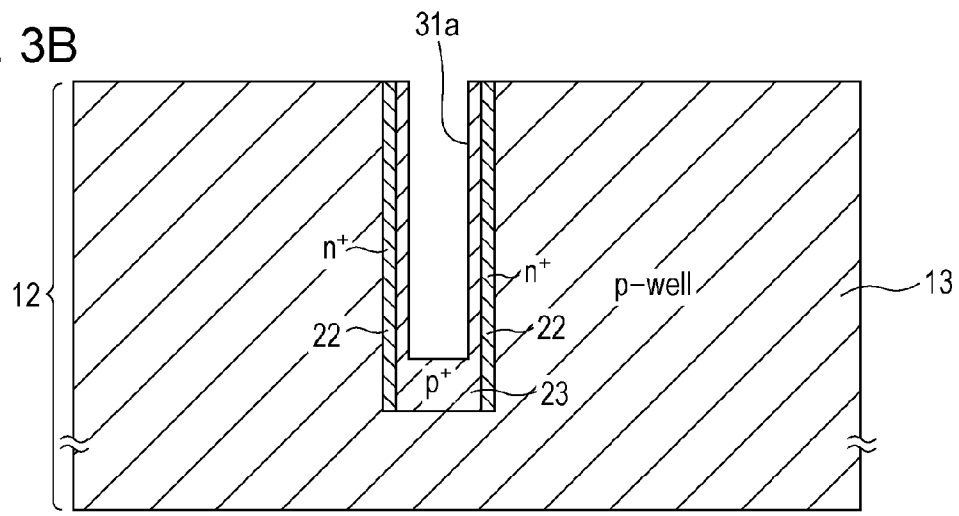

Next, as shown in FIG. 3B, a hole 31a is formed by performing dry etching in the depth direction from the surface of the substrate 12, at the center portion of the p-type semiconductor area 23. The hole 31a forms the through-hole 31 of FIG. 2 and is formed at the same depth as the depth of the photodiode PD formed in the substrate 12, for example, 3 µm to 5 µm.

The dry etching in the process of forming the hole 31a may be performed under the following conditions.

Internal Pressure of Chamber: 20 to 200 (mTorr)
Bias Voltage: 200 to 1000 (W)
Flow Rate of HBr gas: 0 to 400 (sccm)
Flow Rate of $NF_3$ gas: 0 to 50 (sccm)
Flow Rate of $O_2$ gas: 5 to 50 (sccm)

Figure 3C:
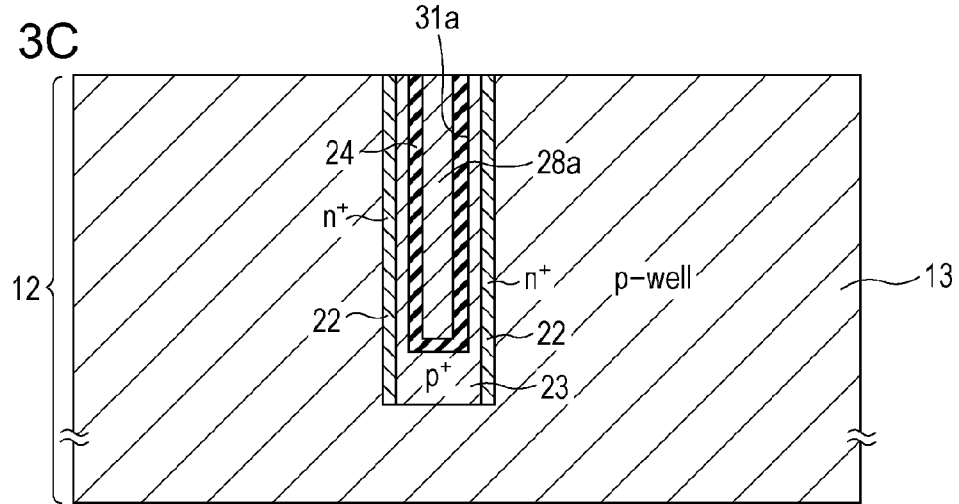

Next, as shown in FIG. 3C, the gate insulating film 24 is formed on the bottom and the inner wall of the hole 31a and then the embedded portion 28a that is a portion embedded in the substrate 12 of the vertical gate electrode 28 is formed by embedding an electrode material.

Figure 4A:
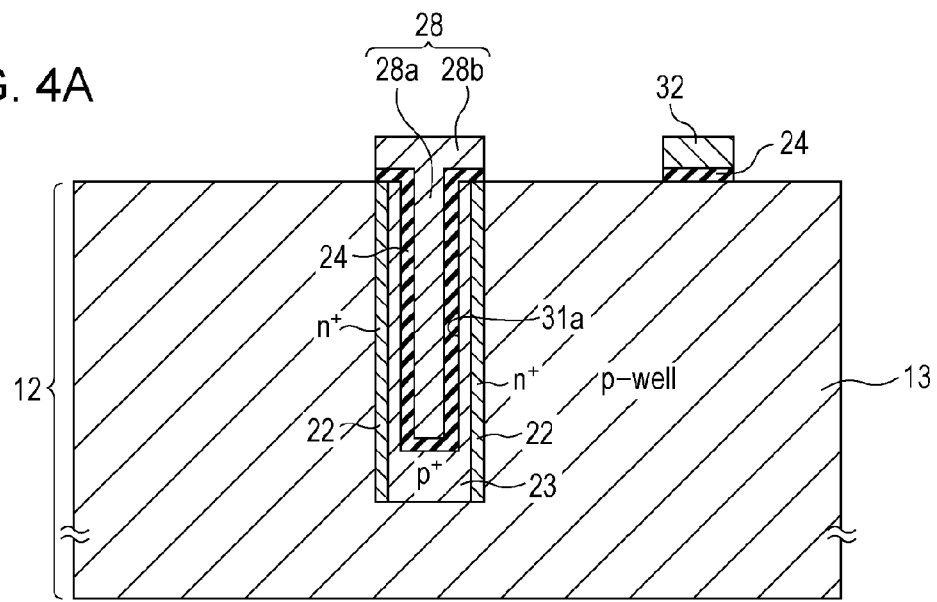
FIGS. 4A and 4B are process diagrams (4 and 5) showing the method of manufacturing the solid-state imaging device according to the first embodiment of the present disclosure.

Thereafter, as shown in FIG. 4A, the surface type gate electrode 32 of the surface type transistor Trb is formed through the gate insulating film 24 in a desired area on the surface of the substrate 12 while the extending portion 28b is formed on the embedded portion 28a. Accordingly, the vertical gate electrode 28 of the vertical transistor Tra is formed.

In the embodiment, although it is exemplified that the embedded portion 28a and the extending portion 28b are formed in different processes, they may be formed in the same process. In this case, first, the gate insulating film 24 is formed on the surface of the substrate 12 while the gate insulating film 24 is formed on the bottom and the inner wall of the hole 31a.

Next, after an electrode material is disposed on the surface of the substrate 12 while the electrode material is embedded in the hole 31a, patterning is performed. Therefore, it is possible to simultaneously form the embedded portion 28a and the extending portion 28b and it is possible to simultaneously form the vertical gate electrode 28 and the surface type gate electrode 32.

Figure 4B:
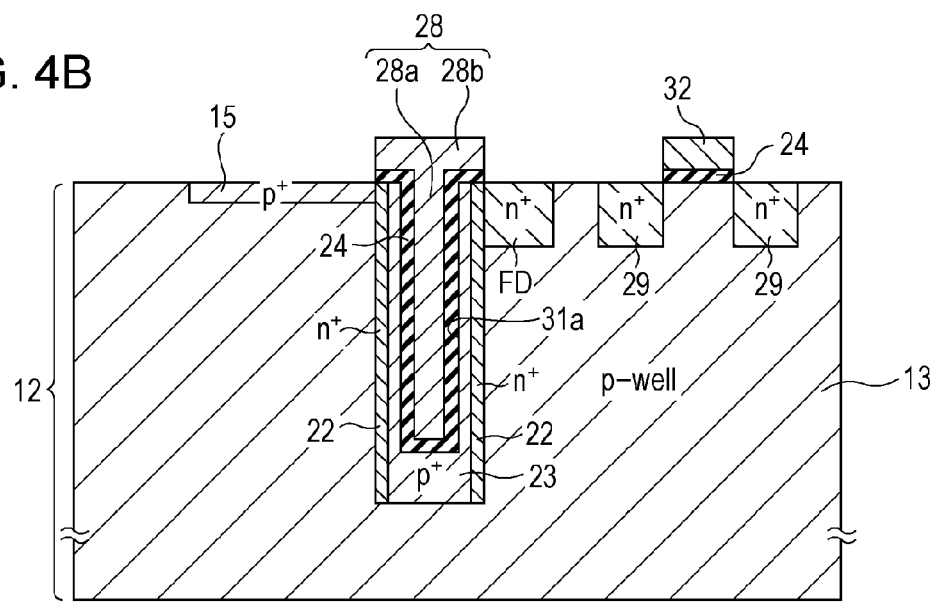

Next, as shown in FIG. 4B, the source/drain areas 29 of the floating diffusion area FD and the surface type transistor Trb are formed by ion-injecting an n-type impurity from the surface of the substrate 12. Further, the p-type semiconductor area 15 that is an anti-dark current area is formed by ion-injecting a p-type impurity into the surface side of the substrate 12. The impurity areas may be formed by self-alignment, with the vertical gate electrode 28 and the surface type gate electrode 32 as masks.

Figure 5A:
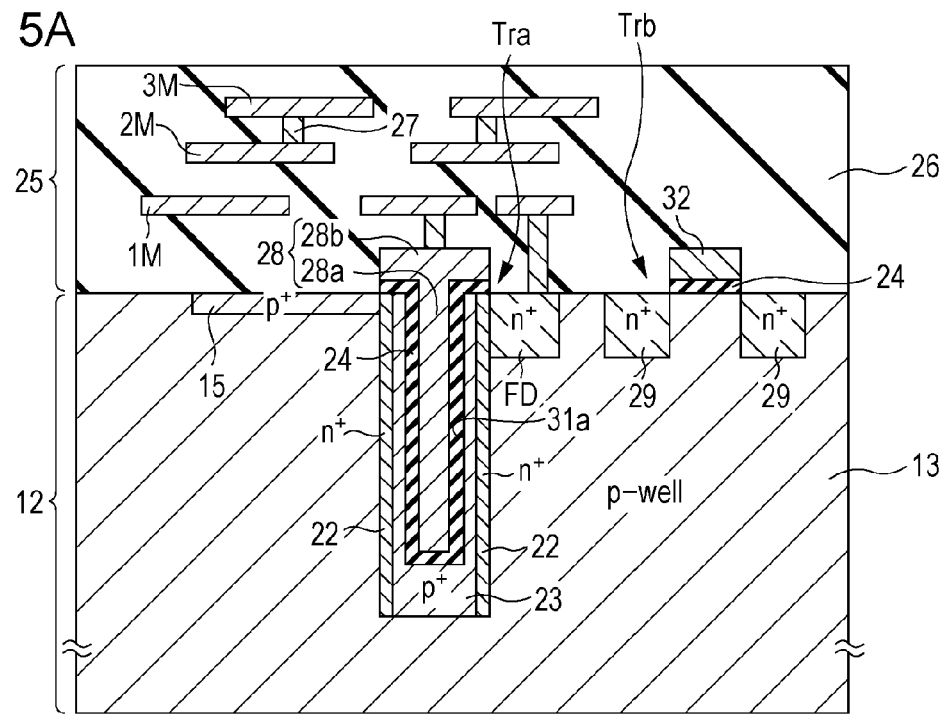
FIGS. 5A and 5B are process diagrams (6 and 7) showing the method of manufacturing the solid-state imaging device according to the first embodiment of the present disclosure.

Next, as shown in FIG. 5A, an interlayer insulating film 26, for example, which is implemented by a silicon oxide film, is formed at the surface side of the substrate 12 where the vertical gate electrode 28 and the surface type gate electrode 32 are formed and the wire layer 25 is formed by repetitively forming the wires 1M to 3M and the interlayer insulating film 26. When a desired pixel transistor and a wire or wires are connected in the formation of the wire layer 25, a hole is formed at the interlayer insulating film 26 and the contact portion 27 is formed by embedding an electrode material, such as tungsten in the hole.

Figure 5B:
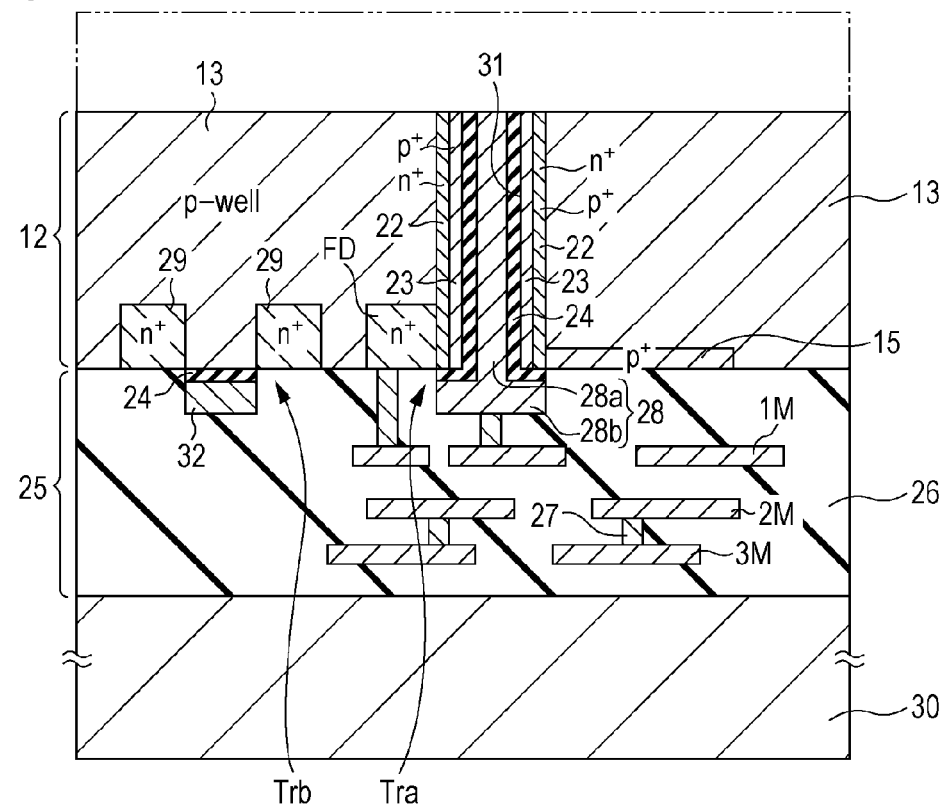

Next, as shown in FIG. 5B, the support substrate 30, for example, which is implemented by a silicon substrate, is bonded onto the wire layer 25 and the substrate 12 is turned over. Further, the thickness of the substrate 12 is reduced by removing the rear surface side of the substrate by using CMP (Chemical Mechanical Polishing), dry etching, or wet etching. Further, the embedded portion 28a of the vertical gate electrode 28 is exposed by removing the gate insulating film 24 formed on the bottom of the embedded portion 28a while reducing the thickness of the substrate 12. Accordingly, the hole 31a becomes the through-hole 31 that is formed through the rear surface side from the surface side of the substrate 12.

The process of reducing the thickness of the substrate 12 may use any one of the methods or a combination of a plurality of methods. Further, when wet etching is used, it is possible to prevent a defect from being generated by the process of reducing the thickness of the substrate 12.

When wet etching is performed on the substrate 12, as an chemical acid agent, fluoro-nitric acid made of hydrofluoric acid (HF) and nitric acid ($HNO_3$), or an etchant made by diluting fluoro-nitric acid with acetic acid ($CH_3COOH$), phosphoric acid ($H_3PO_4$), or sulfuric acid ($H_2SO_4$) may be used. Further, as a chemical alkali agent, tetramethylammonium hydroxide (TMAH), potassium hydroxide (KOH), ammonium hydroxide ($NH_4OH$), sodium hydroxide (NaOH), or ethylene diamine pyrocathecol (EDP) may be used.

Further, when wet etching is performed on the gate insulating film 24 implemented by a silicon oxide film, a hydrofluoric acid (HF)-based chemical agent may be used. Although an example of using a silicon oxide film as the gate insulating film is described in the embodiment, when a silicon oxide film is used as the gate insulating film 24, the material of the gate insulating film 24 can be changed in various ways by using a phosphoric acid-based chemical agent.

Further, when dry etching is performed on the substrate 12 and the gate insulating film 24 implemented by a silicon oxide film, for example, the following conditions may be applied.

Internal Pressure of Chamber: 20 to 200 (mTorr)
Bias Voltage: 200 to 1000 (W)
Flow Rate of HBr gas: 0 to 400 (sccm)
Flow Rate of $NF_3$ gas: 0 to 50 (sccm)
Flow Rate of $O_2$ gas: 5 to 50 (sccm)

Further, when the substrate 12 and the gate insulating film 24 are removed by CMP, for example, the following conditions may be applied.

Abrasion Pressure: 50 to 500 Pa

Number of Revolution of Surface Plate/Number of Revolution of Abrasion Head: 10 to 120 rpm Abrasion Slurry: Silica or Ceria-based Slurry Although the thickness of the substrate 12 may be reduced by a single process, the substrate 12 may be accurately removed to the bottom of the embedded portion 28a of the vertical gate electrode 28 by removing the substrate 12 while measuring the amount of remaining film of the substrate 12. For example, in the first process, the amount of remaining film of the substrate 12 from the bottom of the embedded portion 28a is removed to about 50 nm to 500 nm and the thickness of the substrate 12 is reduced until the embedded portion 28a is exposed in the second process. In this case, wet etching, dry etching, and CMP, which are described above, may also be used.

Figure 6A:
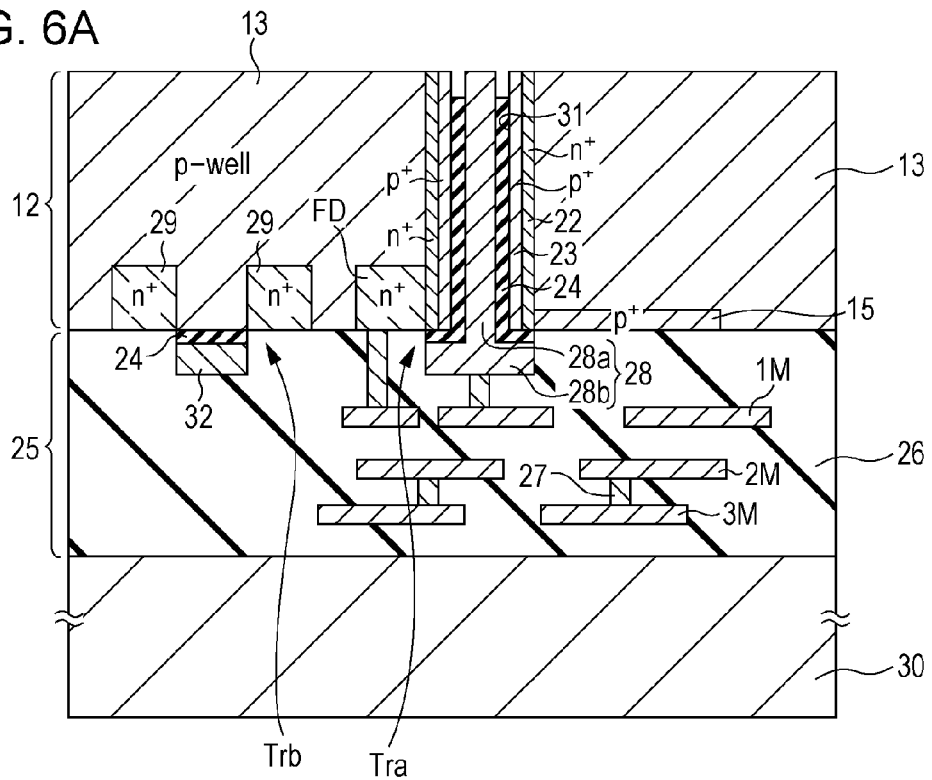
FIGS. 6A and 6B are process diagrams (8 and 9) showing the method of manufacturing the solid-state imaging device according to the first embodiment of the present disclosure.

Thereafter, as shown in FIG. 6A, further, the gate insulating film 24 is removed to a desired depth by using wet etching or dry etching. Accordingly, the inner circumferential surface of the end of the through-hole 31 at the surface side of the substrate 12 is exposed. The depth of removing the gate insulating film 24 is determined by the length of a channel that is necessary for the channel-formed layer 22 formed along the vertical gate electrode 28.

Further, the process of removing the gate insulating film 24 may be performed simultaneously with the reducing of the thickness of the substrate 12 shown in FIG. 5B.

Figure 6B:
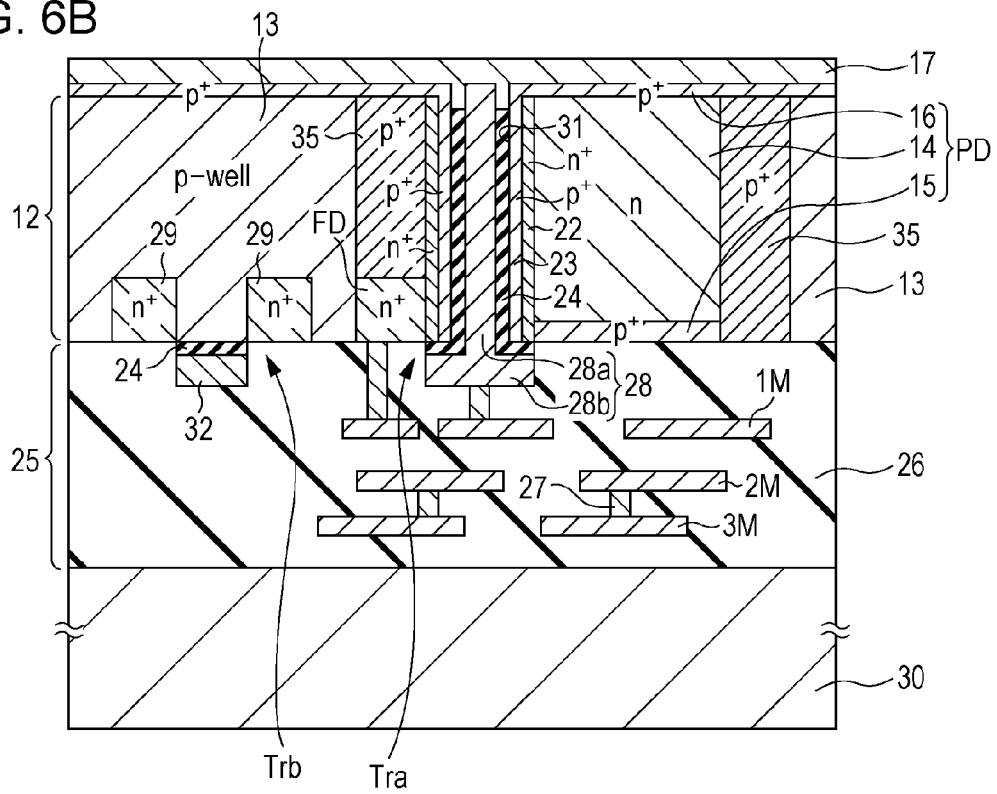

Next, as shown in FIG. 6B, the n-type semiconductor area 14 that is a charge accumulation area is formed by ion-injecting an n-type impurity from the rear surface side of the substrate 12 and the p-type semiconductor area 16 is formed on the n-type semiconductor area 14 by ion-injecting a p-type impurity. Accordingly, the photodiode PD is formed in the photoelectric conversion unit. Further, the pixel separation area that is implemented by the high-density p-type semiconductor area 35 is formed in an area surrounding the photodiode PD. Although an example of forming the photodiode PD by ion injection from the rear surface side of the substrate 12 is described in the embodiment, the ion injection may be performed from the surface side of the substrate 12 in the process of FIG. 6B.

Subsequently, the charge fixing film 17 having negative fixed charges is embedded in the through-hole 31 with the gate insulating film 24 removed while the charge fixing film 17 is formed throughout the rear surface of the substrate 12.

When the charge fixing film 17 is implemented by a hafnium oxide film, atomic layer deposition (ALD) may be used. When the ALD is used, a desired hafnium oxide film can be formed by using, for example, TEMA-HF (Tetrakis ethylmethylamido hafnium), TDMA-Hf (Tetrakis dimethylamido hafnium), or TDEA-Hf (Tetrakis diethylamido hafnium), under a film formation substrate temperature of 200° C. to 500° C., a flow rate of precursor of 10 cm$^3$/min to 500 cm$^3$/min, a radiation time of precursor of 1 second to 15 seconds, and a flow rate of ozone ($O_3$) of 5 cm$^3$/min to 50 cm$^3$/min, in precursor.

It is possible to form the charge fixing film 17 with high accuracy even on the concave-convexo surface of the end of the through-hole 31 that can be achieved by removing the gate insulating film 24, by using the ALD.

Further, the hafnium oxide film that is used for the charge fixing film 17 may be formed by metalorganic chemical vapor deposition (MOCVD). When the MOCVD is used, a desired hafnium oxide film can be formed by using, for example, TEMA-Hf (Tetrakis ethylmethylamido hafnium), TDMA-Hf (Tetrakis dimethylamido hafnium), or TDEA-Hf (Tetrakis diethylamido hafnium), under a film formation substrate temperature of 200° C. to 600° C., a flow rate of a precursor of 10 cm$^3$/min to 500 cm$^3$/min, a radiation time of a precursor of 1 second to 15 seconds, and a flow rate of ozone ($O_3$) of 5 cm$^3$/min to 50 cm$^3$/min, in precursor.

Figure 7:
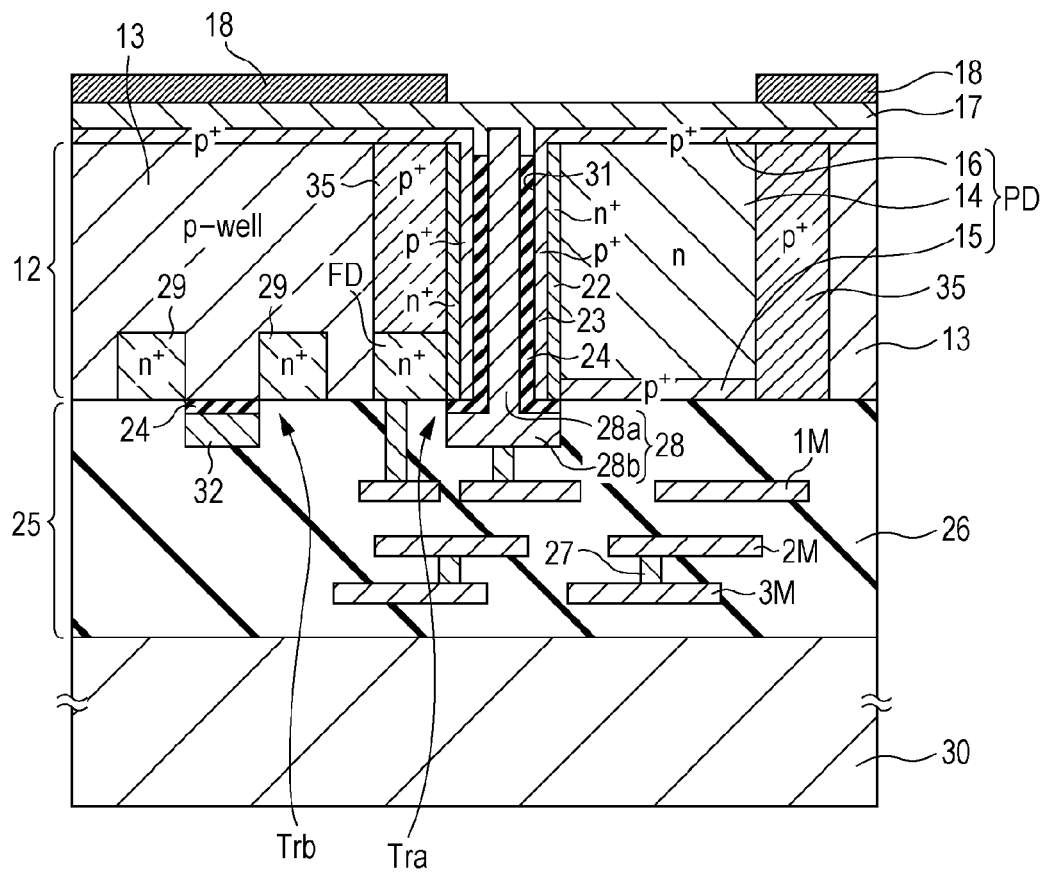
FIG. 7 is a process diagram (10) showing the method of manufacturing the solid-state imaging device according to the first embodiment of the present disclosure.

Next, as shown in FIG. 7, the slight shield film 18 of which the area where the photodiode PD is formed is open is formed.

Thereafter, the planarizing film 19 where the light shield film 18 is embedded is formed, and then the color filter layer 20 and the on-chip lens 21 are formed, thereby completing the solid-state imaging device 1 according to the embodiment shown in FIG. 2.

In the solid-state imaging device 1 according to the embodiment, a portion of the rear surface side of the gate insulating film 24 formed in the through-hole 31 is actively removed and the charge fixing film 17 having negative fixed charges is formed instead. The end of the through-hole 31 where the charge fixing film 17 is formed is an area with many defects generated when the hole 31a is formed, corresponding to the hole 31a formed in the substrate 12 in the process of FIG. 3B. In the embodiment, since the inner circumferential surface of the end of the through-hole 31 with many defects is covered with the charge fixing film 17, carriers abnormally generated from the end of the through-hole 31 to the corners of the rear surface side of the substrate 12 are prevented from flowing into the photodiode PD.

Accordingly, white points are restrained from being generated. Further, the rear surface side of the substrate 12 is planarized by forming the charge fixing film 17 on the rear surface side of the substrate 12. Therefore, the film formed on the charge fixing film 17 is also planarized, such that the mixing of colors is restrained.

Further, in the solid-state imaging device 1 according to the embodiment, since the vertical gate electrode 28 of the transfer transistor is embedded in the depth direction of the substrate 12, it is possible to read out the signal charges accumulated deep in the substrate 12. Therefore, it is possible to form the photodiode PD deep in the depth direction of the substrate 12, such that it is possible to increase the quantity of saturated charges Qs.

Further, in the embodiment, it is exemplified that the p-type semiconductor area 16 is formed on the rear surface side of the substrate 12 to restrain dark current at the interface of the substrate 12. However, when a pinning effect of the interface of the substrate 12 by the charge fixing film 17 having negative fixed charges can be sufficiently achieved, the p-type semiconductor area 16 on the rear surface of the substrate 12 may not be formed.

However, in the embodiment, the rear surface of the substrate 12 and the bottom of the embedded portion 28a are positioned at the same surface by reducing the thickness of the substrate 12 until the bottom of the embedded portion 28a of the vertical gate electrode 28 is exposed in the process of FIG. 5B. The process of reducing the thickness of the substrate 12 of the embodiment is not limited thereto and the process of FIG. 5B may be a process of reducing the thickness until the gate insulating film 24 formed on the bottom of the embedded portion 28a is exposed. After the thickness of the substrate 12 is reduced, when the gate insulating film 24 is removed, the bottom of the embedded portion 28a and the rear surface side of the substrate 12 are not made level and the bottom of the embedded portion 28a is positioned lower than the rear surface of the substrate 12 in the through-hole 31.

Further, a process of reducing the thickness of the substrate 12 such that the rear surface side of the substrate 12 is positioned lower than the bottom of the embedded portion 28a of the vertical gate electrode 28 may be possible. In this case, the embedded portion 28a may be removed after the thickness of the substrate 12 is reduced until the bottom of the embedded portion 28a is exposed. As in the process of FIG. 6A, when only the gate insulating film 24 is removed, the embedded portion 28a before the charge fixing film 17 is formed and the substrate 12 are brought in contact, such that leak current may flow. Therefore, it is possible to avoid the contact between the embedded portion 28a and the substrate 12 by removing the end of the embedded portion 28a simultaneously with removing the gate insulating film 24.

As described above, this can be applied to the embodiment even if the bottom of the embedded portion 28a is recessed or protruding, with respect to the rear surface of the substrate 12.

The charge fixing film 17 is formed in one layer, but it may be formed by stacking a plurality of kinds of films having negative fixed charges. Further, when the charge fixing film 17 is formed of a plurality of kinds of films, it may be formed with differences in the strength of the fixing charges of the stacked charge fixing film 17. For example, a charge fixing film 17 having relatively weak charge fixing is formed close to the embedded portion 28a of the vertical gate electrode 28, while a charge fixing film 17 having strong charge fixing is formed far from the vertical gate electrode 28. Accordingly, it is possible to restrain dark current at the end of the through-hole 31 and on the rear surface side of the substrate 12 without decreasing the transfer efficiency of the signal charges in the vertical gate electrode 28.

2. Second Embodiment

A method of manufacturing a solid-state imaging device according to a second embodiment of the present disclosure is described. The entire configuration and the cross-sectional configuration of the solid-state imaging device formed in the embodiment is the same as those of FIGS. 1 and 2 and only the manufacturing method is described.

Figure 9A:
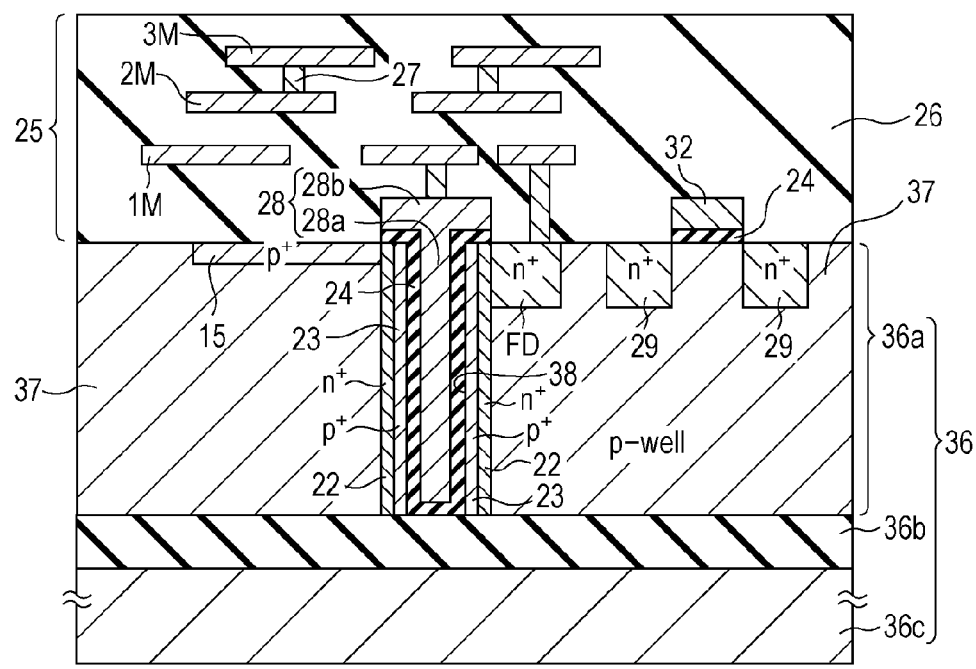
FIGS. 9A and 9B are process diagrams (4 and 5) showing the method of manufacturing the solid-state imaging device according to the second embodiment of the present disclosure.
Figure 9B:
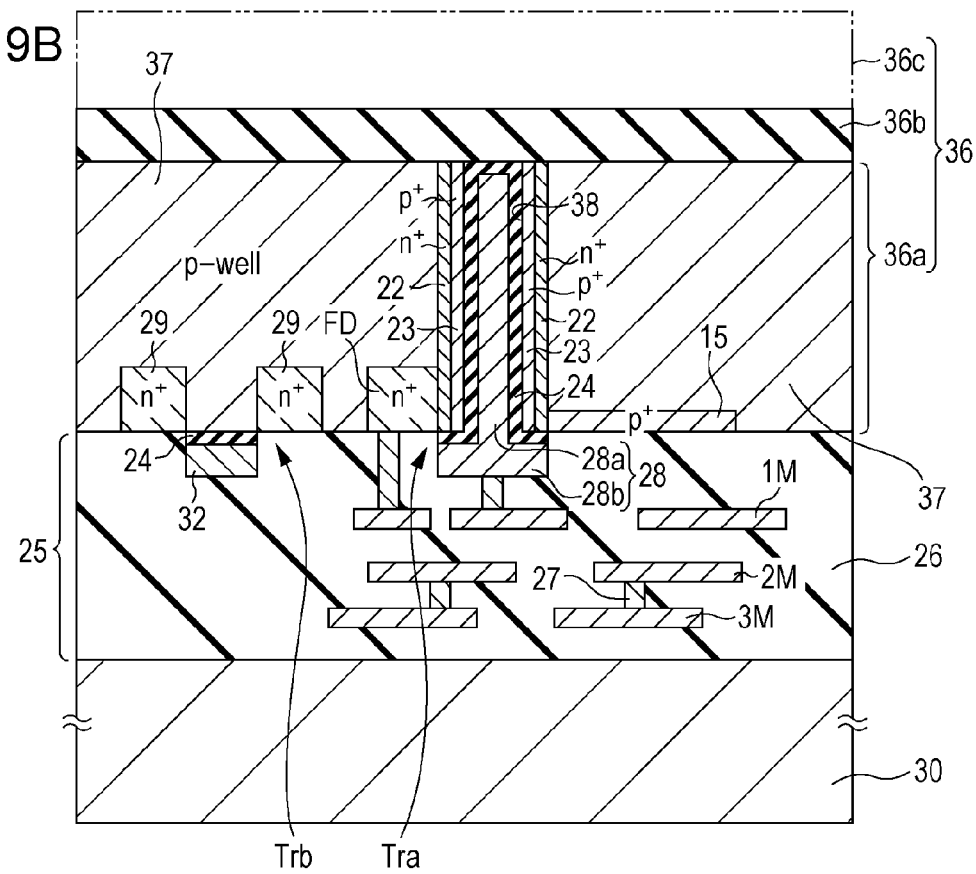
Figure 10:
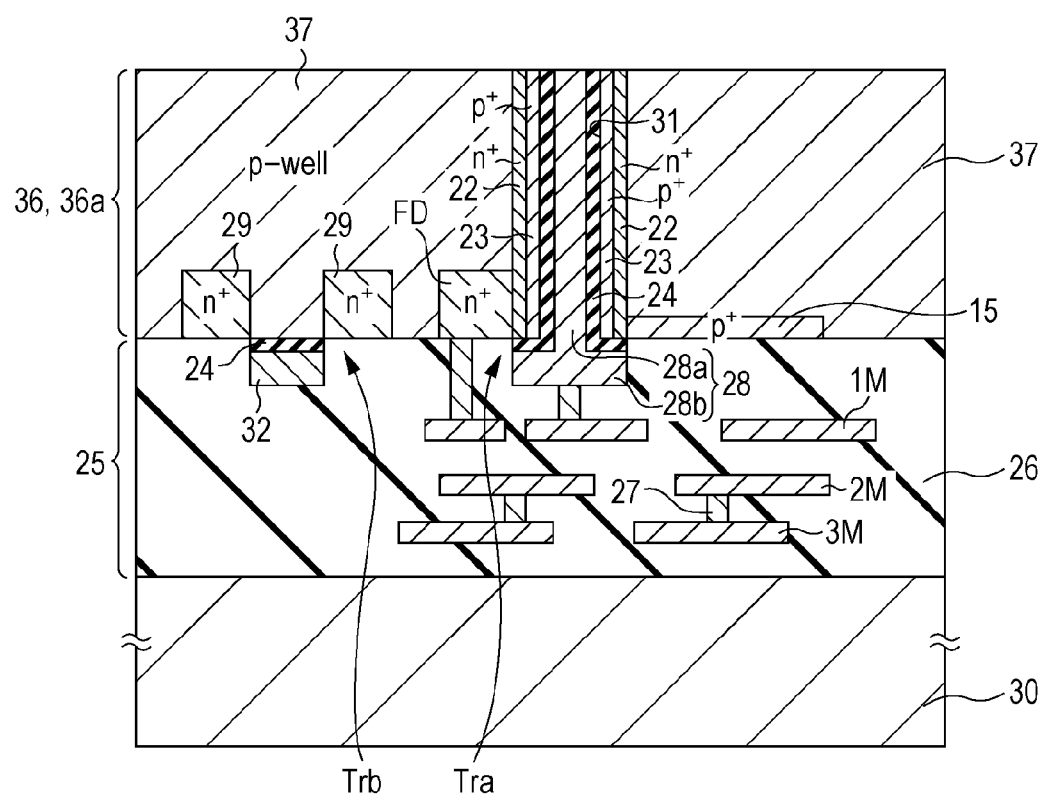
FIG. 10 is a process diagram (6) showing the method of manufacturing the solid-state imaging device according to the second embodiment of the present disclosure.

FIGS. 8 to 10 are views showing a manufacturing process of the method of manufacturing the solid-state imaging device according to the embodiment.

The embodiment is an example of using an SOI substrate 36 as a substrate.

Figure 8A:
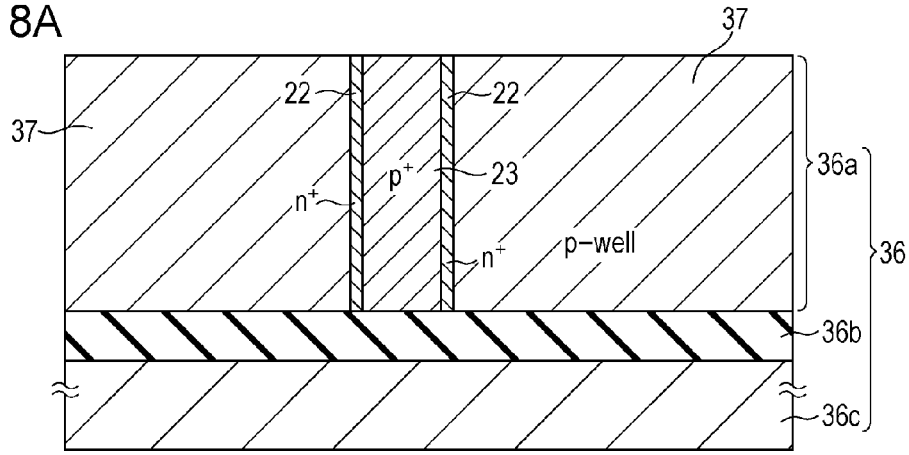
FIGS. 8A, 8B, and 8C are process diagrams (1 to 3) showing a method of manufacturing a solid-state imaging device according to a second embodiment of the present disclosure.

First, as shown in FIG. 8A, an SOI substrate 36 having an n-type monocrystal silicon layer 36a formed through a BOX layer 36c that is a silicon oxide layer is provided on a silicon substrate 36. The monocrystal layer 36a is a layer where a photodiode PD or a pixel transistor is formed and the thickness is necessary for the photodiode PD, for example, 3 μm to 5 μm. A p-type well area 37 is formed by ion-injecting a p-type impurity into the monocrystal silicon layer 36a of the SOI substrate 36. Thereafter, in the area where the through-hole 31 is formed, a p-type semiconductor area 23, that is, the area wider than the diameter of the formed through-hole 31, is formed from the surface of the monocrystal silicon layer 36a to the BOX layer 36b by ion-injecting a p-type impurity. Further, a channel-formed layer 22 is formed by ion-injecting an n-type impurity around the p-type semiconductor area 23.

Figure 8B:
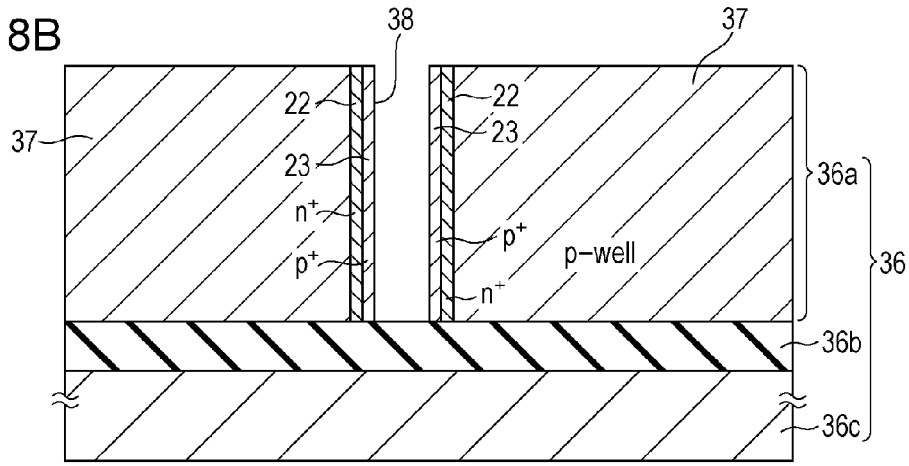

Next, as shown in FIG. 8B, a hole 38 is formed by dry etching in the depth direction from the surface of the monocrystal silicon layer 36a at the center portion of the p-type semiconductor area 23. The hole 38 is the through-hole 31 of FIG. 2 and is formed deep such that the BOX layer 36b is exposed.

Figure 8C:
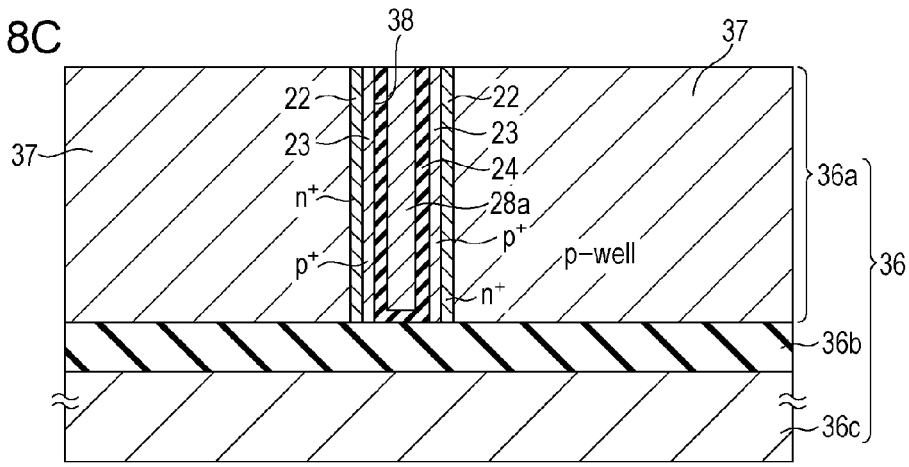

Next, as shown in FIG. 8C, the gate insulating film 24 is formed on the bottom and the inner wall of the hole 38 and then the embedded portion 28a that is a portion embedded in the monocrystal silicon layer 36a (corresponding to the substrate of the disclosure) of the vertical gate electrode 28 is formed by embedding an electrode material.

Subsequently, similar to the processes of FIGS. 4A to 5A of the first embodiment, as shown in FIG. 9A, a vertical transistor Tra, a surface type transistor Trb, and a wire layer 25 are formed in a desired area on the surface of the monocrystal silicon layer 36a.

Next, as shown in FIG. 9B, a support substrate 30, for example, which is a silicon substrate, is bonded onto the wire layer 25 and the SOI substrate 36 is turned over. Further, the silicon substrate 36c at the rear surface side of the SOI substrate 36 is removed by using CMP, dry etching, or wet etching.

Next, as shown in FIG. 10, the embedded portion 28a of the vertical gate electrode 28 is exposed by removing the BOX layer 36b, the monocrystal silicon layer 36a, and the gate insulating film 24 formed on the bottom of the embedded portion 28a. Accordingly, the hole 38 becomes the through-hole 31 formed through the rear surface side from the surface side of the monocrystal silicon layer 36a.

Although the BOX layer 36b may be removed by a single process, it may be accurately removed to the bottom of the embedded portion 28a of the vertical gate electrode 28 by removing the BOX layer 36b while measuring the amount of remaining film of the BOX layer 36b. For example, in the first process, the amount of remaining film of the BOX layer 36b is removed to about 50 nm to 500 nm and the BOX layer 36b is removed until the embedded portion 28a is exposed in the second process. In this case, wet etching, dry etching, and CMP, which are described above, may also be used.

Further, when the BOX layer 36b is removed through two processes, first wet etching is performed by using, for example, an etchant with an HF concentration of 5 to 50% and second wet etching is performed by using an etchant with an HF concentration of 0.1 to 10%. Accordingly, it is possible to accurately remove the BOX layer 36b by removing the BOX layer 36b with rapid etching up to a predetermined depth and removing it with slow etching.

Thereafter, the solid-state imaging device shown in FIG. 2 is completed by the same processes as those of FIGS. 6A and 7 of the first embodiment.

According to the method of manufacturing a solid-state imaging device according to the embodiment, a hole 38 that becomes the through-hole 31 can be formed by boring the monocrystal silicon layer 36a, with the BOX layer 36b of the SOI substrate 36 as a stopper. Therefore, it is possible to reduce non-uniformity in the pixels of the embedded portion 28a of the vertical gate electrode 28.

Further, it is possible to achieve the same effect as the first embodiment.

3. Third Embodiment

Figure 11:
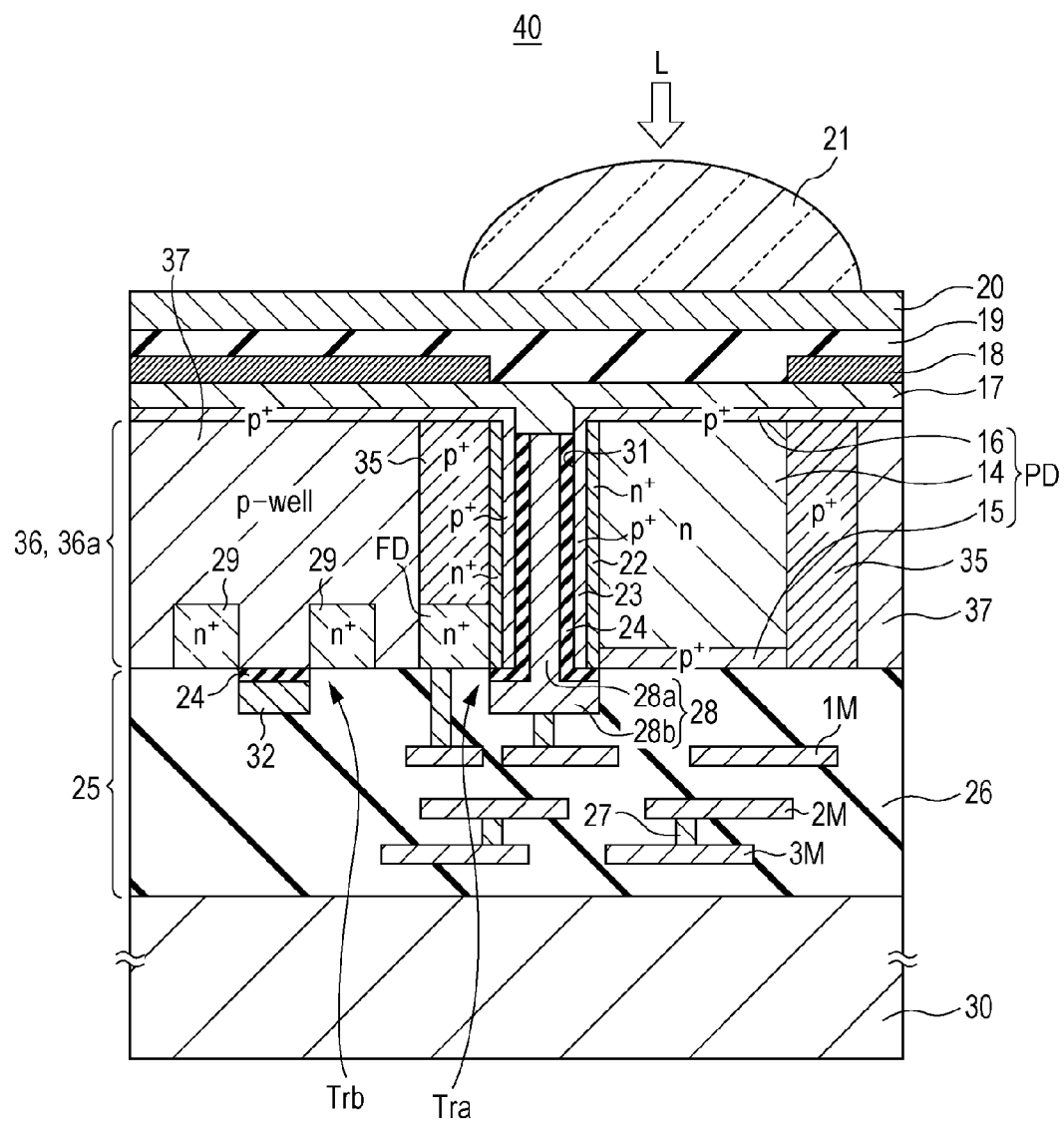
FIG. 11 is a schematic cross-sectional configuration view showing the main part of a solid-state imaging device according to a third embodiment of the present disclosure.

A solid-state imaging device and a method of manufacturing the solid-state imaging device according to a third embodiment of the present disclosure are described. FIG. 11 shows a schematic cross-sectional configuration of a solid-state imaging device 40 according to the embodiment. The portions corresponding to those of FIG. 2 are given the same reference numerals as those of FIG. 11 and repetitive description is not provided. Further, the entire configuration of the solid-state imaging device 40 according to the embodiment is the same as that of FIG. 1 and repetitive description is not provided.

3-1. Configuration of Main Part

As shown in FIG. 11, in the solid-state imaging device 40 according to the embodiment, the bottom of an embedded portion 28a of a vertical gate electrode 28 is formed lower than the rear surface side of a substrate in a through-hole 31 (the monocrystal silicon layer 36a of the SOI substrate 36 in the embodiment).

3-2. Manufacturing Method

Figure 13A:
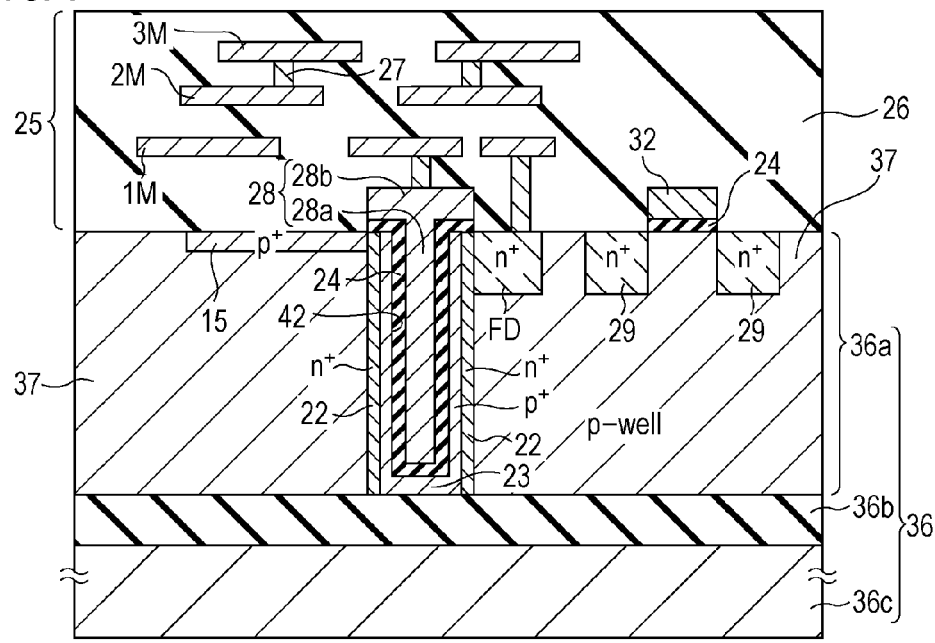
FIGS. 13A and 13B are process diagrams (4 and 5) showing the method of manufacturing the solid-state imaging device according to the third embodiment of the present disclosure.
Figure 13B:
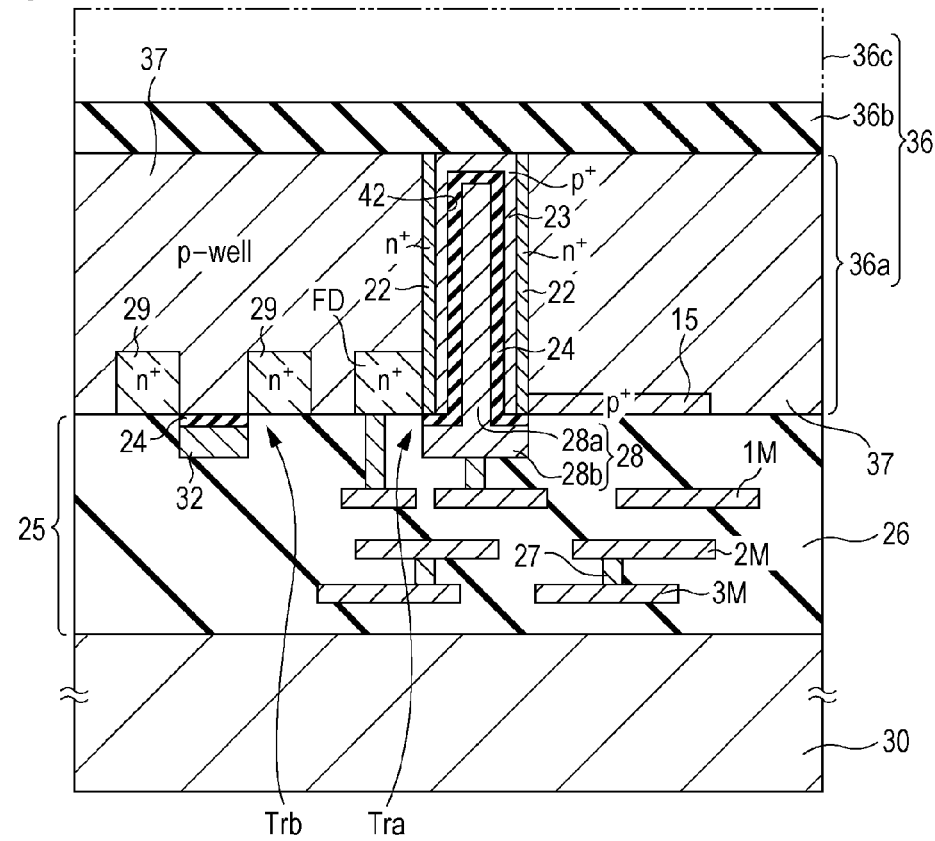
Figure 14A:
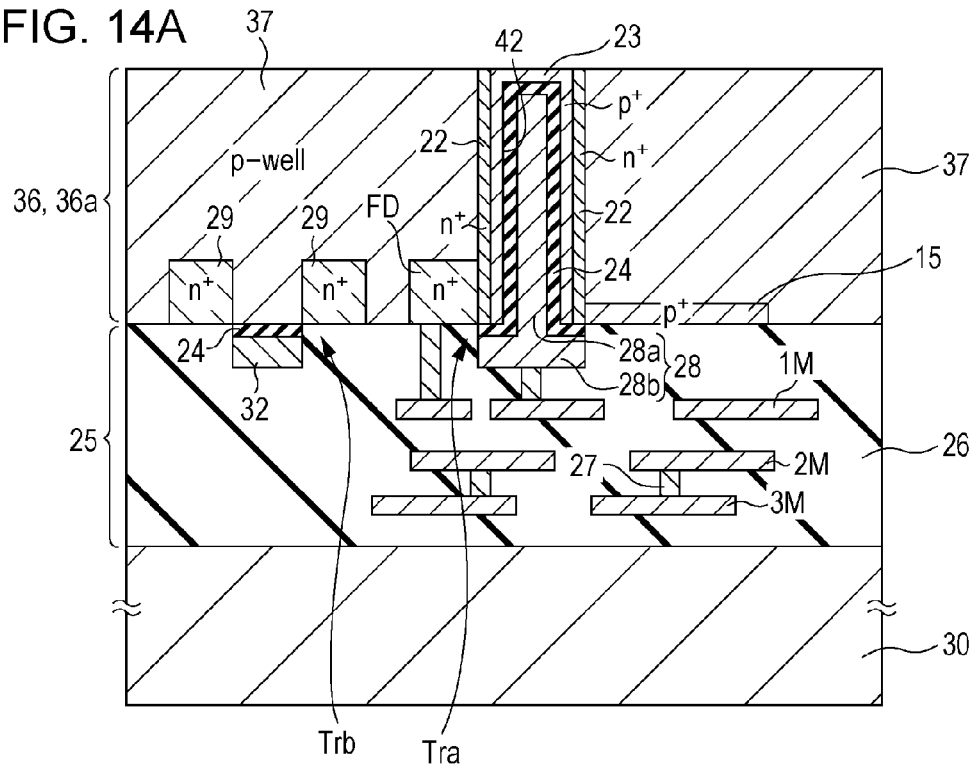
FIGS. 14A and 14B are process diagrams (6 and 7) showing the method of manufacturing the solid-state imaging device according to the third embodiment of the present disclosure.

A manufacturing process of the solid-state imaging device 40 according to the embodiment is shown in FIGS. 12 and 14. The portions corresponding to those of FIGS. 8 to 10 are given the same reference numerals in FIGS. 12 to 14 and repetitive description is not provided.

Figure 12A:
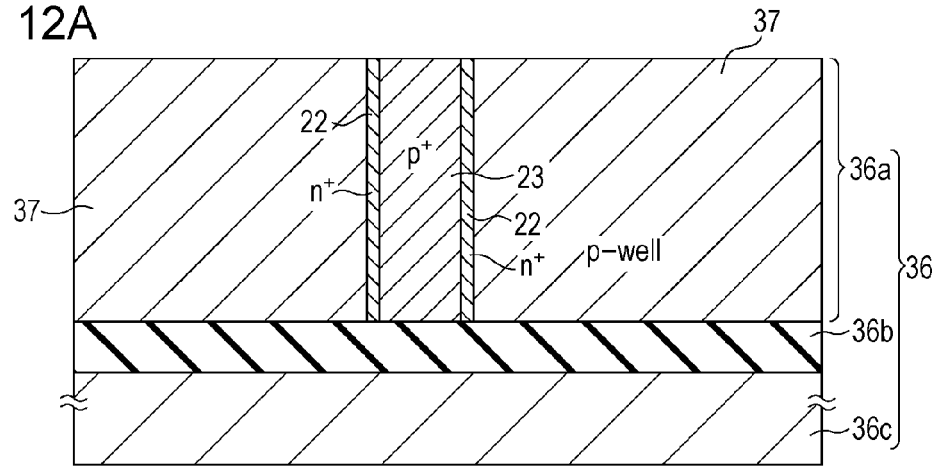
FIGS. 12A, 12B, and 12C are process diagrams (1 to 3) showing a method of manufacturing a solid-state imaging device according to the third embodiment of the present disclosure.

First, as shown in FIG. 12A, an SOI substrate having an n-type monocrystal silicon layer 36a formed through a BOX layer 36b that is a silicon oxide layer is provided on a silicon substrate 36c. The monocrystal silicon layer 36a is a layer where a photodiode PD or a pixel transistor is formed and the thickness is smaller than the thickness that is necessary for the photodiode PD. A p-type well area 37 is formed by ion-injecting a p-type impurity into the monocrystal silicon layer 36a of the SOI substrate 36. Thereafter, a p-type semiconductor area 23 is formed by ion-injecting a p-type impurity in the area where the through-hole 31 is formed. The p-type semiconductor area 23 is an area wider than the diameter of the through-hole 31, which is formed in a later process, and the p-type semiconductor area 23 is formed at a depth where at least an embedded portion 28a of a vertical gate electrode 28 is formed from the surface of the monocrystal silicon layer 36a. Further, a channel-formed layer 22 is formed by ion-injecting an n-type impurity around the p-type semiconductor area 23.

Figure 12B:
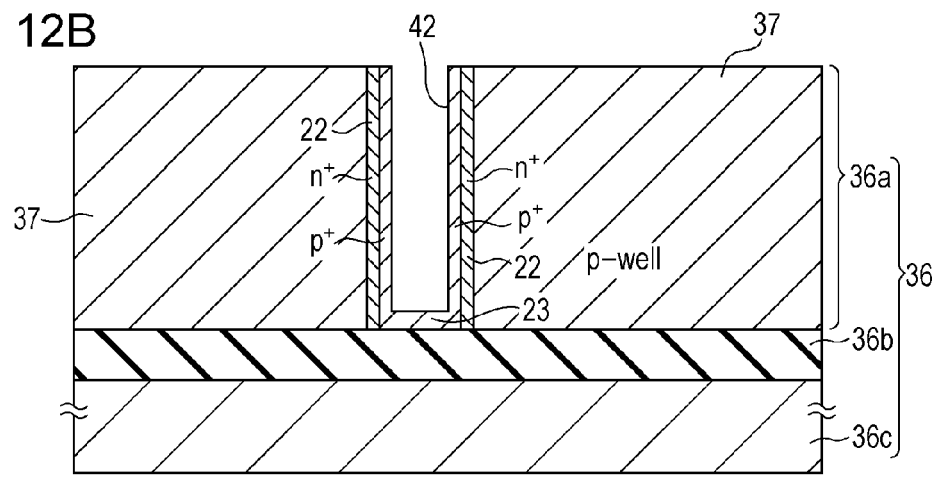

Next, as shown in FIG. 12B, a hole 42 is formed by dry etching in the depth direction from the surface of the monocrystal silicon layer 36a at the center portion of the p-type semiconductor area 23.

The hole 42 is formed by the through-hole 31 of FIG. 11 and is formed deep not to reach the BOX layer 36b and the monocrystal silicon layer 36a on the BOX layer 36b is formed at a depth of 50 nm to 500 nm.

Figure 12C:
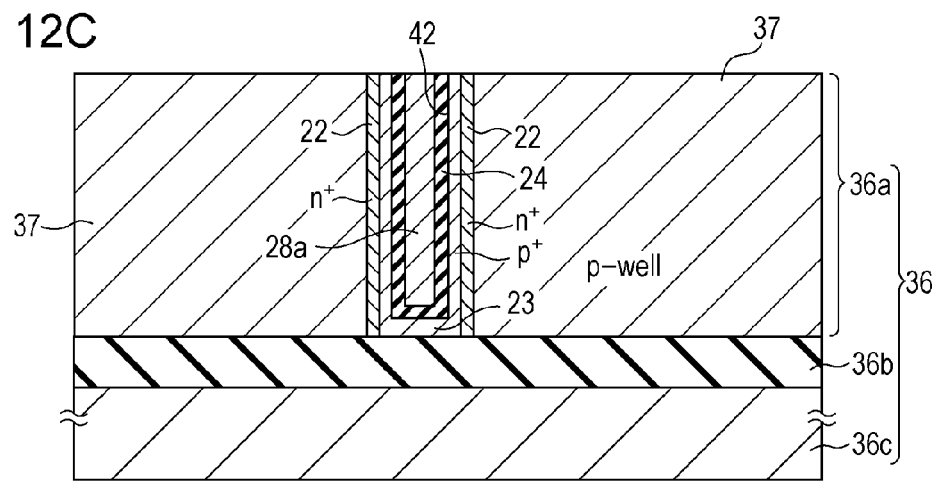

Next, as shown in FIG. 12C, the gate insulating film 24 is formed on the bottom and the inner circumferential surface of the hole 42 and then the embedded portion 28a that is a portion embedded in the monocrystal silicon layer 36a of the vertical gate electrode 28 is formed by embedding an electrode material.

Subsequently, similar to the processes of FIGS. 4A to 5A of the first embodiment, as shown in FIG. 13A, a vertical transistor Tra, a surface type transistor Trb, and a wire layer 25 are formed in a desired area on the surface of the monocrystal silicon layer 36a.

Next, as shown in FIG. 13B, a support substrate 30, for example, which is a silicon substrate, is bonded onto the wire layer 25 and the SOI substrate 36 is turned over. Further, the silicon substrate 36c at the rear surface side of the SOI substrate 36 is removed by using CMP, dry etching, or wet etching.

Figure 14B:
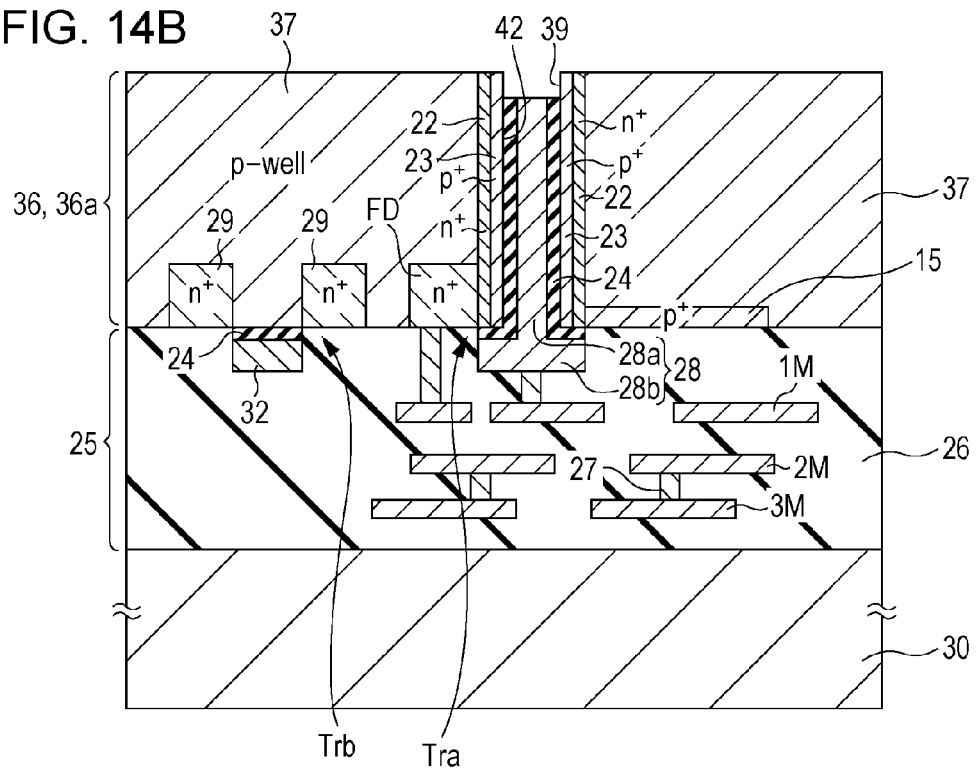

Next, as shown in FIG. 14B, the BOX layer 36b is removed by using CMP, dry etching, or wet etching. The BOX layer 36b may be removed by the same process as that of the second embodiment.

Next, as shown in FIG. 14B, a rear hole 39 that exposes the bottom of the embedded portion 28a is formed by performing dry etching toward the surface side from the rear surface of the monocrystal silicon layer 36a. Accordingly, the hole 42 and the rear hole 39 are connected and the through-hole 31 is formed through the monocrystal silicon layer 36a. The depth from the rear surface side of the monocrystal silicon layer 36a, where the rear hole 39 is formed, is determined not to reach the area that is an actual channel when charges are transferred, on the channel-formed layer 22 formed along the embedded portion 28a of the vertical gate electrode 28.

Figure 15:
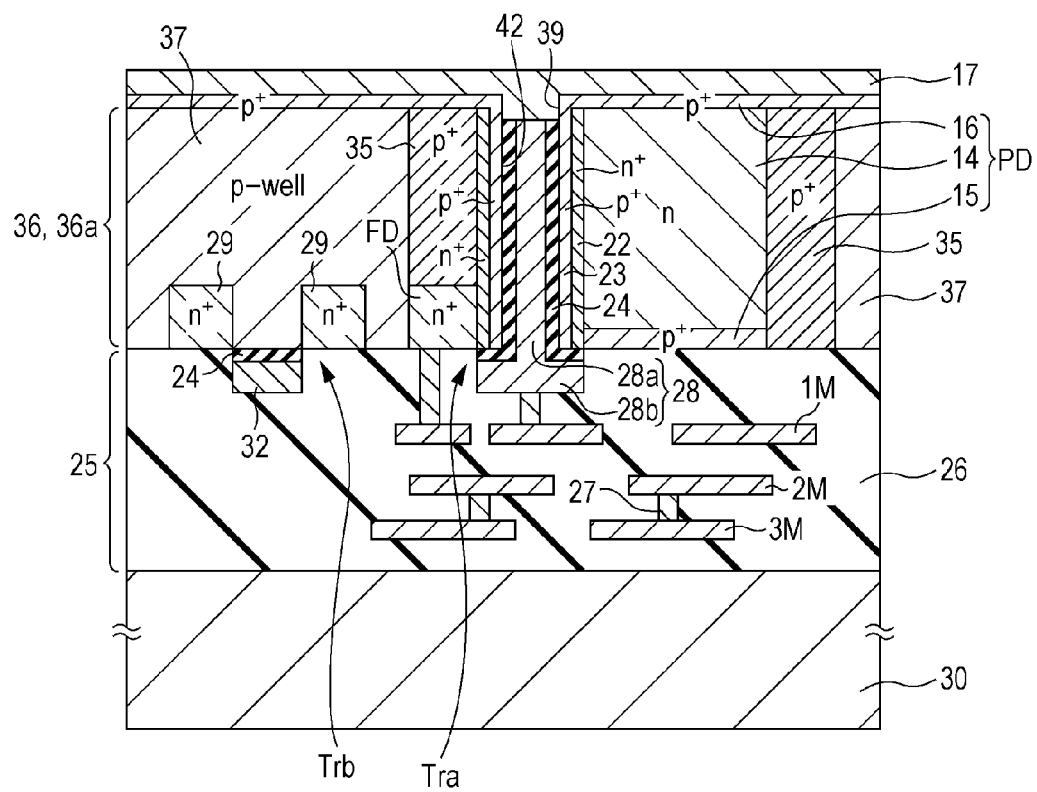
FIG. 15 is a process diagram (8) showing the method of manufacturing the solid-state imaging device according to the third embodiment of the present disclosure.

Next, as shown in FIG. 15, a charge fixing film 17 having negative fixed charges is formed to cover the entire rear surface of the monocrystal silicon layer 36a while the rear hole 39 is filled.

Thereafter, the solid-state imaging device 40 shown in FIG. 11 is completed by the same processes as those of FIGS. 6A and 7 of the first embodiment.

In the solid-state imaging device 40 according to the embodiment, since it is possible to provide a large thickness to the charge fixing film 17 that is in contact with the bottom of the embedded portion 28a of the vertical gate electrode 28, it is possible to further increase the pinning effect of carriers abnormally generated on the bottom of the embedded portion 28a. Further, it is possible to achieve the same effect as the first embodiment.

4. Fourth Embodiment

Figure 16:
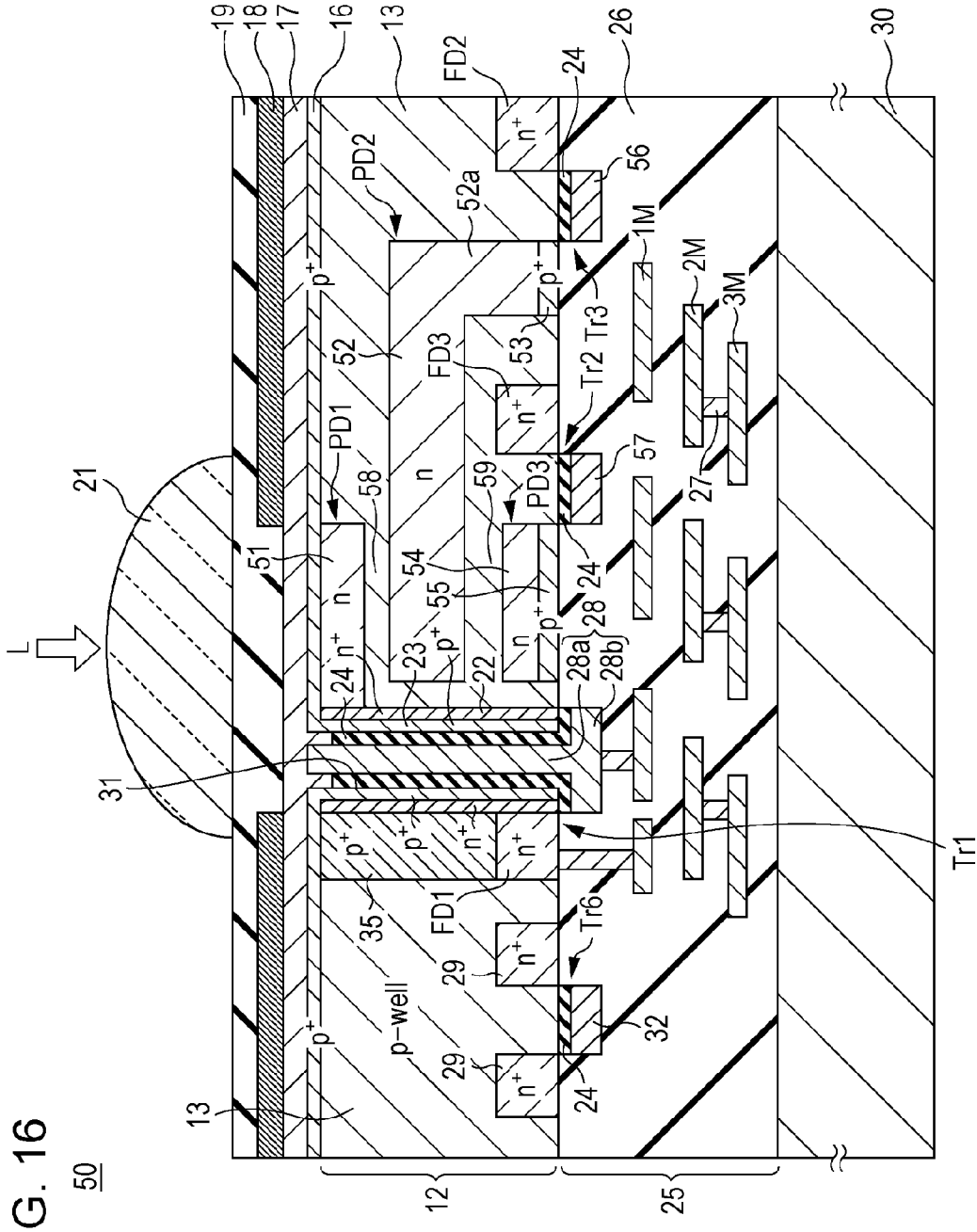
FIG. 16 is a schematic cross-sectional configuration view showing the main part of a solid-state imaging device according to a fourth embodiment of the present disclosure.

A solid-state imaging device according to a fourth embodiment of the present disclosure is described. FIG. 16 is a schematic cross-sectional configuration view of a solid-state imaging device 50 according to the embodiment. The portions corresponding to those of FIG. 12 are given the same reference numerals in FIG. 16 and repetitive description is not provided.

The solid-state imaging device 50 according to the embodiment, as shown in FIG. 16, includes first to third photodiodes PD1, PD2, and PD3 sequentially formed in the depth direction in order from the rear surface side of a substrate 12. Further, first to third transfer transistors Tr1, Tr2, and Tr1 corresponding to the first to third photodiodes PD1, PD2, and PD3 are provided.

The first photodiode PD1 is implemented by pn-bonding between a p-type semiconductor area 16 formed at the rear surface side of the substrate 12 and an n-type semiconductor area 51 that is in contact with the p-type semiconductor area 16. The n-type semiconductor area 51 is a charge accumulation area where signal charges generated by the first photodiode PD1 are accumulated. Further, the p-type semiconductor area 16 has a function of restraining dark current that is generated on the rear surface side of the substrate. The first photodiode PD1 is formed 0.1 µm to 0.4 µm deep from the light incidence surface of the substrate 12 and light having a wave length of blue is mainly photoelectrically converted in the first photodiode PD1.

The second photodiode PD2 is implemented by pn-bonding between a p-type semiconductor area 58 under the n-type semiconductor area 52 that is a charge accumulation area of the first photodiode PD1 and the n-type semiconductor area 52 formed under the p-type semiconductor area 58. The n-type semiconductor area 52 is a charge accumulation area where signal charges generated by the second photodiode PD2 are accumulated. Further, the p-type semiconductor area 58 may be implemented by a p-type well area 13 or may be formed by separate ion injection. The p-type semiconductor area 58 also functions as a separation area between the first photodiode PD1 and the second photodiode PD2. Further, in the second photodiode PD2, a charge transfer path 52a is formed by the n-type semiconductor area formed vertically across the n-type semiconductor area 52 of the second photodiode PD2 from the surface of the substrate 12. Further, a p-type semiconductor area 53 for restraining dark current is formed on the surface of the substrate 12 on the charge transfer path 52a. The second photodiode PD2 is formed 0.4 µm to 0.8 µm deep from the light incidence surface of the substrate 12 and light having a wave length of green is mainly photoelectrically converted in the second photodiode PD2.

The third photodiode PD3 is implemented by pn-bonding between a p-type semiconductor area 59 formed under the n-type semiconductor area 52, an n-type semiconductor area 54 formed under the p-type semiconductor area 59, and a p-type semiconductor area 55 formed at the surface side of the substrate 12. The n-type semiconductor area 54 is a charge accumulation area where signal charges generated by the third photodiode PD3 are accumulated. Further, the p-type semiconductor area 59 may be implemented by a p-type well area 13 or may be formed by separate ion injection. The p-type semiconductor area 59 also functions as a separation area between the second photodiode PD2 and the third photodiode PD3. The third photodiode PD3 is formed 0.8 µm to 2.5 µm deep from the light incidence surface of the substrate 12 and light having a wave length of red is mainly photoelectrically converted in the third photodiode PD3.

Further, the p-type semiconductor area 55 formed at the surface side of the substrate 12 restrains dark current that is generated at the interface of the substrate 12.

The first transfer transistor Tr1 is composed of a vertical gate electrode 28 formed at the through-hole 31 formed through the substrate 12 and a floating diffusion area FD1 formed at the surface side of the substrate 12 adjacent to the vertical gate electrode 28. That is, the first transfer transistor Tr1 is implemented by a vertical transistor. In the first transfer transistor Tr1, signal charges accumulated in the first photodiode PD1 are read out to the floating diffusion area FD1 through a channel formed on the channel-formed layer 22 by applying a desired voltage to the vertical gate electrode 28.

The second transfer transistor Tr2 is composed of a floating diffusion area FD2 formed in the area adjacent to the charge transfer path 52a at the surface side of the substrate 12 and a surface type gate electrode 56 formed through the gate insulating film 24 on the surface of the substrate 12. That is, the second transfer transistor is implemented by a surface type transistor. In the second transfer transistor Tr2, signal charges accumulated in the second photodiode PD2 are read out to the floating diffusion area FD2 through the charge transfer path 52a by applying a desired voltage to the surface type gate electrode 56.

The third transfer transistor Tr3 is composed of a floating diffusion area FD3 formed in the area adjacent to the third photodiode PD3 at the surface side of the substrate 12 and a surface type gate electrode 57 formed through the gate insulating film 24 on the surface of the substrate 12. That is, the third transfer transistor is implemented by a surface type transistor. In the third transfer transistor Tr3, signal charges accumulated in the third photodiode PD3 are read out to the floating diffusion area FD3 by applying a desired voltage to the surface type gate electrode 57.

The solid-state imaging device 50 according to the embodiment may be formed by the same process as that of the first embodiment, different from the process of forming the first to third photodiode PD1, PD2, and PD3 in the depth direction of the substrate 12.

In the embodiment, the incident light traveling on the rear surface side of the substrate 12 in the vertical direction of the substrate 12 can be dispersed into red (R), green (G), and blue (B) by the first to third photodiodes PD1, PD2, and PD3 formed in the depth direction of the substrate 12. Accordingly, the pixel area can be effectively used. Further, since the light can be dispersed in the substrate 12, it is not necessary to form a color filter layer at the light incidence side of the substrate 12. Therefore, light is not absorbed in the color filter layer and the sensitivity is improved.

Further, the signal charges accumulated in the first photodiode PD1 formed at the innermost rear surface side of the substrate are read out by the vertical gate electrode 28 embedded in the depth direction of the substrate 12, such that it is not necessary to form a charge transfer path that is implemented by an impurity diffusion layer in the substrate 12. Therefore, at the rear surface side of the substrate 12, it is possible to increase the quantity of saturated charges Qs for the photodiode formed at the rear surface side of the substrate 12, without reducing the area where the photodiode is formed due to the formation of the charge transfer path.

Further, it is possible to achieve the same effect as the first embodiment.

5. Fifth Embodiment

Figure 17:
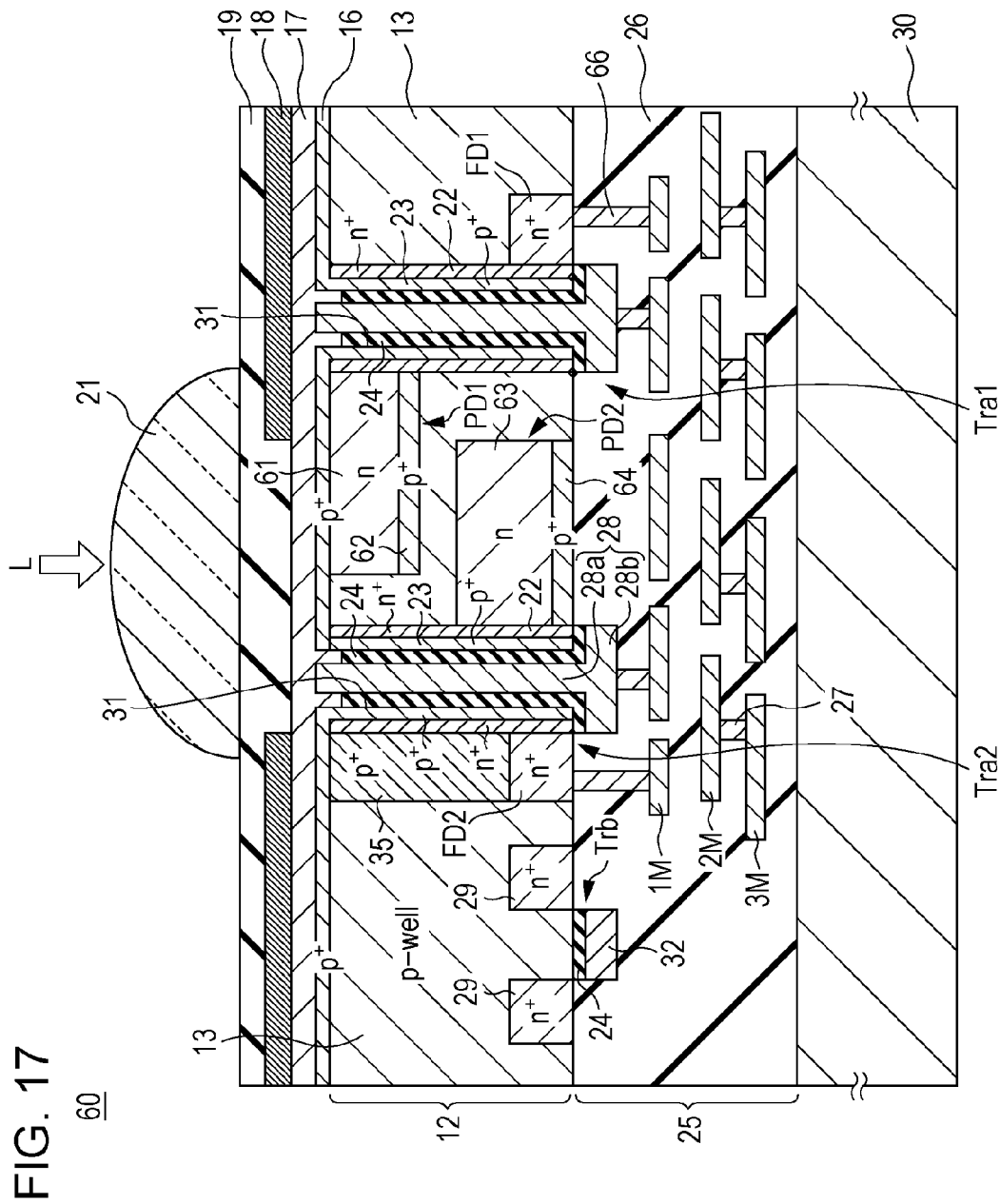
FIG. 17 is a schematic cross-sectional configuration view showing the main part of a solid-state imaging device according to a fifth embodiment of the present disclosure.

A solid-state imaging device according to a fifth embodiment of the present disclosure is described. FIG. 17 is a schematic cross-sectional configuration view of a solid-state imaging device 60 according to the embodiment. The portions corresponding to those of FIG. 2 are given the same reference numerals in FIG. 17 and repetitive description is not provided.

The solid-state imaging device 60 according to the embodiment, as shown in FIG. 17, includes first and second photodiodes PD1 and PD2 sequentially formed in the depth direction in order from the rear surface side of a substrate 12. Further, first and second transfer transistors Tra1 and Tra2 corresponding to the first and second photodiodes PD1 and PD2 are provided.

The first photodiode PD1 is implemented by pn-bonding between a p-type semiconductor area 16 formed at the rear surface side of the substrate 12 and an n-type semiconductor area 61 that is in contact with the p-type semiconductor area 16, and a p-type semiconductor area 62 formed under the n-type semiconductor area 61. The n-type semiconductor area 61 is a charge accumulation area where signal charges generated by the first photodiode PD1 are accumulated. Further, the p-type semiconductor area 16 has a function of restraining dark current that is generated on the rear surface side of the substrate. Further, the p-type semiconductor area 62 formed under the n-type semiconductor area 61 also functions as an area between the second photodiode PD2 formed under the first photodiode PD1.

The second photodiode PD2 is implemented by pn-bonding between an n-type semiconductor area 63 formed under the first photodiode PD1 and a p-type semiconductor area 64 formed at the surface side of the substrate 12. The n-type semiconductor area 63 is a charge accumulation area where signal charges generated by the second photodiode PD2 are accumulated. Further, the p-type semiconductor area 64 has a function of restraining dark current that is generated on the surface of the substrate 12.

The first transfer transistor Tra1 is composed of a vertical gate electrode 28 formed in the through-hole 31 formed through the substrate 12 and a floating diffusion area FD2 formed on the surface of the substrate 12. That is, the first transfer transistor Tra1 becomes a vertical transistor. A channel-formed layer 22 of the vertical gate electrode 28 of the first transfer transistor Tra1 is formed in contact with the n-type semiconductor area 61 that is a charge accumulation area of the first photodiode PD1. In the first transfer transistor Tra1, when a desired voltage is applied to the vertical gate electrode 28, the signal charges accumulated in the n-type semiconductor area 61 of the first photodiode PD1 are transferred to the first floating diffusion area FD1.

The second transfer transistor Tra2 is composed of a vertical gate electrode 28 formed in the through-hole 31 formed through the substrate 12 and a floating diffusion area FD2 formed on the surface of the substrate 12. That is, the second transfer transistor Tra2 becomes a vertical transistor. A channel-formed layer 22 of the vertical gate electrode 28 of the second transfer transistor Tra2 is formed in contact with the n-type semiconductor area 63 that is a charge accumulation area of the second photodiode PD2. In the second transfer transistor Tra2, when a desired voltage is applied to the vertical gate electrode 28, the signal charges accumulated in the n-type semiconductor area 63 of the second photodiode PD2 are transferred to the second floating diffusion area FD2.

The solid-state imaging device 60 according to the embodiment may be formed by the same process as that of the first embodiment, different from the process of forming the first and second photodiode PD1 and PD2 in the depth direction of the substrate 12. In this case, the vertical transistors of the first and second transfer transistors Tra1 and Tra2 may be formed to correspond to the photodiodes, respectively.

In the solid-state imaging device 60 according to the embodiment, it is possible to vertically disperse light with the first and second photodiodes PD1 and PD2 formed in the depth direction of the substrate 12. Although two layers of photodiodes are formed as an example in FIG. 16, it is possible to form two or more layers of photodiodes and vertically disperse light. For example, when RGB light dispersion is formed vertically in the substrate 12, a color filter layer may not be formed.

Further, in the embodiment, the signal charges of the first and second photodiodes PD1 and PD2 formed at different depths in the substrate 12 are read out by the first and second transfer transistors Tra1 and Tra2, which are implemented by vertical transistors. Accordingly, it is not necessary to form a charge transfer path for transferring the signal charges to the surface side of the substrate 12 and it is possible to enlarge a photodiode area.

In the solid-state imaging device 60 according to the embodiment, the first and second transfer transistors Tra1 and Tra2 were implemented by vertical transistors having the vertical gate electrode 28 formed at the through-hole 31 formed through the substrate 12. Therefore, even if a plurality of layers of photodiodes are formed in the depth direction, it is possible to form the transfer transistors with the same process, because it may be possible to form holes (through-holes 31) at the same depth in the manufacturing process, such that it is possible to reduce non-uniformity in the manufacturing.

Further, it is possible to achieve the same effect as the first embodiment.

The present disclosure is not limited to a solid-state imaging device that detects and takes an image of the distribution of incident amount of visible light and may be applied to a solid-state imaging device that takes an image of the distribution of the incident amount of the infrared light, X-ray, particles or the like. Further, in a broad sense, the present disclosure may be applied to solid-state imaging devices (device of detecting physical quantity distribution), such as a fingerprint detecting sensor that takes an image of the distribution of other physical quantities, such as pressure or capacitance.

Further, embodiments of the present disclosure are not limited to the first to fifth embodiments described above and may be changed in various ways. Further, in the examples described above, it is described when an n-channel MOS transistor is implemented, but a p-channel MOS transistor may be implemented. For the p-type MOS transistor, the conductive type is inverted in the figures.

Further, the present disclosure is not limited to a solid-state imaging device that reads out pixel signals from unit pixels by sequentially scanning the unit pixels in a pixel unit along the lines.

The present disclosure may be applied to an X-Y address type solid-state imaging device that selects a predetermined pixel in a pixel unit and reads out a signal from the corresponding selected pixel in the pixel unit.

Further, the solid-state imaging device may be a single chip type or a module type having an imaging function in which a pixel unit and a signal processing unit or an optical system are packaged.

Further, the present disclosure is not limited to a solid-state imaging device and may be applied to an imaging device. The imaging device implies a camera system, such as a digital camera or a video camera, or an electronic apparatus having an imaging function, such as a mobile phone. Further, the imaging device may also be implemented as a module type mounted in an electronic apparatus, that is, as a camera module type.

6. Sixth Embodiment: Electronic Apparatus

Figure 18:
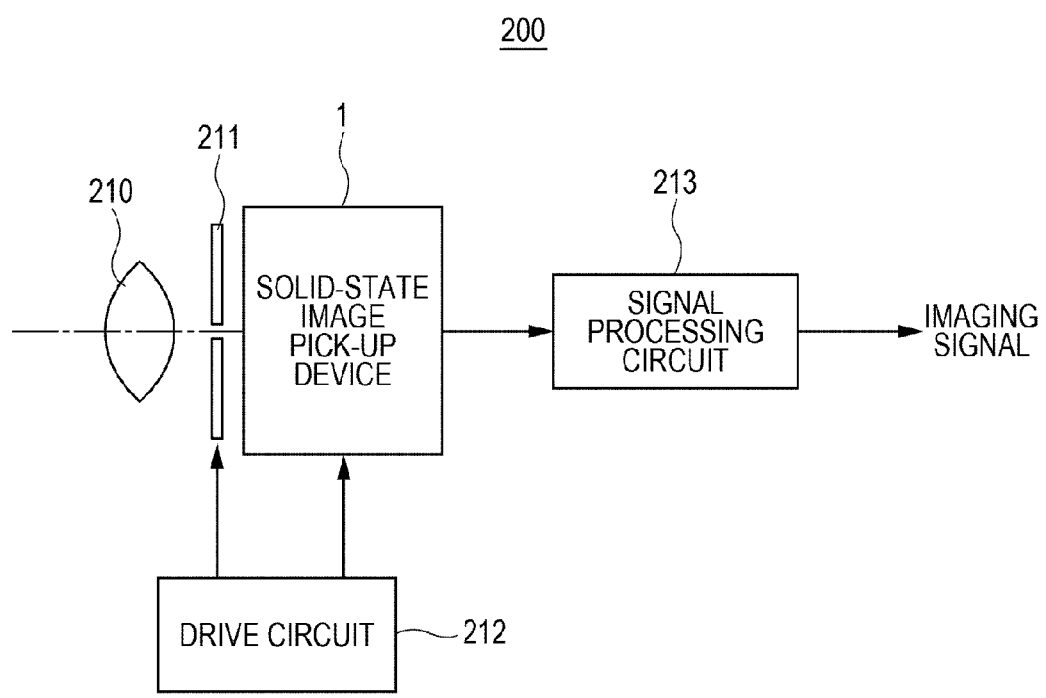
FIG. 18 is a schematic cross-sectional configuration view showing an electronic apparatus according to a sixth embodiment of the present disclosure.
Figure 19:
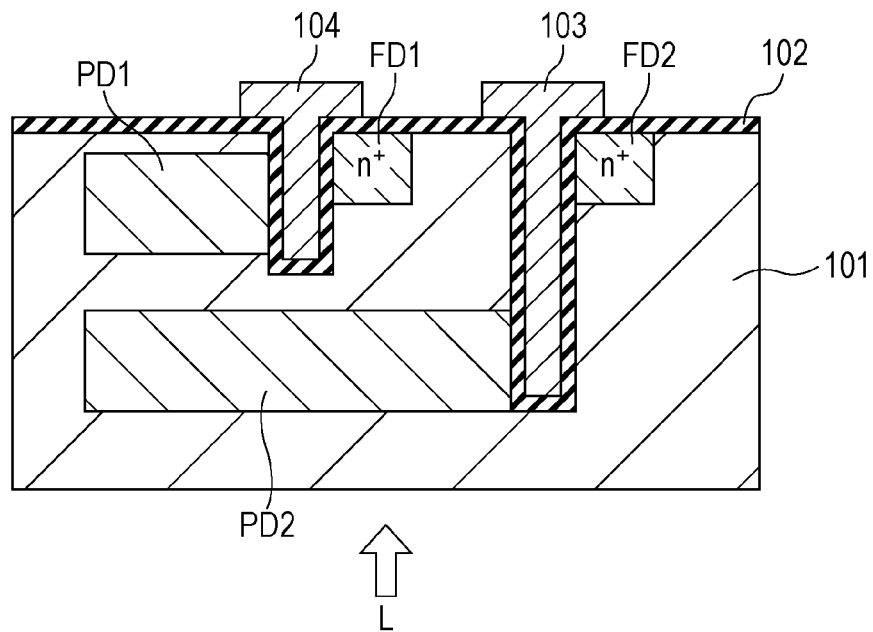
FIG. 19 is a schematic cross-sectional configuration view of a solid-state imaging device (1) of the related art.
Figure 20:
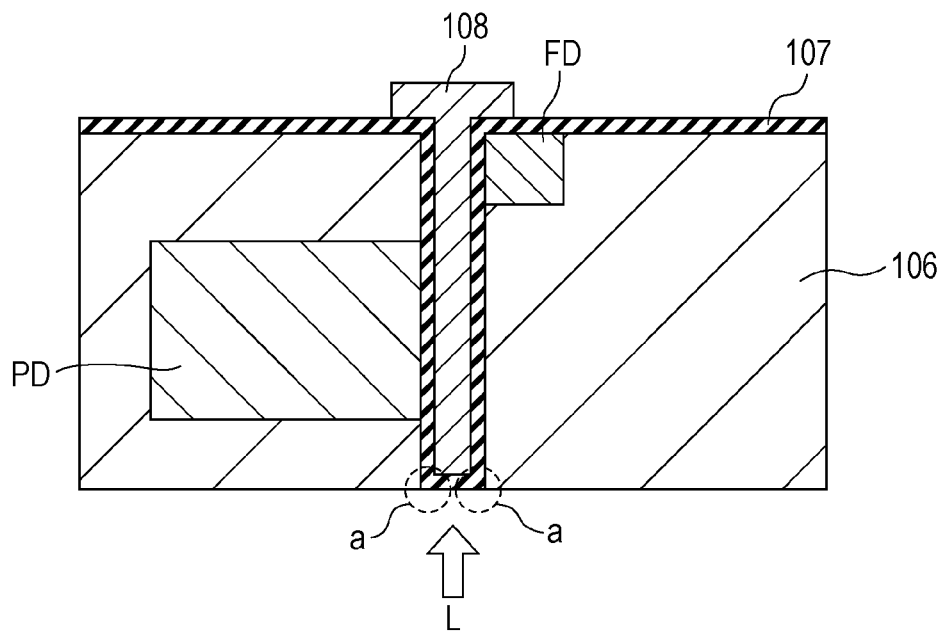
FIG. 20 is a schematic cross-sectional configuration view of a solid-state imaging device (2) of the related art.

An electronic apparatus according to a sixth embodiment of the present disclosure is described. FIG. 18 is a schematic cross-sectional configuration view showing the main part of an electronic apparatus 200 according to a sixth embodiment of the present disclosure.

The electronic apparatus 200 according to the embodiment is an embodiment when the solid-state imaging device 1 of the first embodiment of the present disclosure is used for an electronic apparatus (camera).

The electronic apparatus 200 according to the embodiment includes a solid-state imaging device 1, an optical lens 210, a shutter mechanism 211, a driving circuit 212, and a signal processing circuit 213.

The optical lens 210 forms an image on an image surface of the solid-state imaging device 1, using image light (incident light) from an object. Accordingly, corresponding signal charges are accumulated for a predetermined period in the solid-state imaging device 1.

The shutter mechanism 211 controls periods of radiating and blocking light traveling to the solid-state imaging device 1.

The driving circuit 212 supplies a driving signal for controlling a transmitting operation of the solid-state imaging device 1 and a shutting operation of the shutter mechanism 211. Signal transmission of the solid-state imaging device 1 is performed by the driving signal (timing signal) supplied from the driving circuit 212. The signal processing unit 213 performs various signal processing. A video signal that has undergone the signal processing is stored in a storing medium, such as a memory, or output to a monitor.

In the solid-state imaging device 1 of the electronic apparatus 200 according to the embodiment, the rear surface side of a substrate where pixels are formed and a portion of the inside of a through-hole where a vertical gate electrode is formed are coated with a charge fixing film having negative fixed charges, such that the generation of white points is prevented and the image quality can be improved.

The electronic apparatus 200 equipped with the solid-state imaging device 1 is not limited to a camera and may be applied to imaging devices, such as a digital camera and the camera modules for mobile devices, such as a mobile phone.

Although the solid-state imaging device 1 is used for an electronic apparatus in the embodiment, it may be possible to use the solid-state imaging devices manufactured by the second to fifth embodiments described above.

The present disclosure contains subject matter related to that disclosed in Japanese Priority Patent Application JP 2010-227757 filed in the Japan Patent Office on Oct. 7, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging device, comprising:
    forming a gate insulating film lined hole with a desired depth extending from a front surface side of a substrate toward a rear surface side of the substrate;
    forming a vertical gate electrode that causes a reading-out portion formed at a surface side of the substrate to read out the signal charges accumulated in a photoelectric conversion unit by embedding an electrode material into the gate insulating film lined hole;
    forming a wire layer where a plurality of layers of wires are stacked, on the front surface side of the substrate in an interlayer insulating film;
    turning over the substrate after bonding a support substrate onto the wire layer;
    removing the gate insulating film formed in the through-hole to a predetermined depth and reducing the thickness of the substrate until the hole extends to the rear surface side of the substrate; and
    forming a charge fixing film having negative fixed charges covering the entire rear surface of the substrate and filling the through-hole where the gate insulating film was removed with the charge fixing claim.

2. The method according to claim 1, wherein the substrate is a bulk substrate.

3. The method according to claim 1, wherein the substrate is an SOI substrate having a monocrystal silicon layer formed through a silicon oxide layer, on a silicon substrate.

4. The method according to claim 3, wherein the hole is formed deep such that the silicon oxide layer is exposed from the surface of the monocrystal silicon layer.

5. The method according to claim 1, wherein the reducing of the thickness of the substrate is performed by wet etching several times.

6. The method according to claim 1, wherein one or a plurality of layers of insulating films are further formed on the charge fixing film after the charge fixing film is formed.

7. The method according to claim 1, wherein the charge fixing film has a structure of stacking two or more kinds of layers.

8. A method, comprising:
    providing a substrate with oppositely facing front and rear surfaces;
    forming a gate insulting film lined hole in the substrate extending from the front surface to a predetermined depth;
    filing the hole with an electrode material;
    forming a wiring layer on the rear surface, the wiring layer comprised of an insulating film containing wires;
    reducing a thickness of the substrate until the hole extend to the rear surface;
    removing a portion of the gate insulating film; and
    forming a charge fixing film across the rear surface with the charge fixing film extending into that portion of the hole where the gate insulating film was removed.

9. The method of claim 8, wherein the substrate is a bulk substrate.

10. The method of claim 8, wherein the substrate is an SOI substrate having a monocrystal silicon layer on a silicon oxide layer on a silicon substrate.

11. The method of claim 10, wherein the hole is formed to a depth such that it extends through the silicon oxide layer and the monocrystal silicon layer.

12. The method of claim 8, wherein the step of reducing of the thickness of the substrate comprises wet etching the substrate a plurality of times.

13. The method of claim 8, further comprising forming at least one insulating film on the charge fixing film after the charge fixing film is formed.

14. The method of claim 8, wherein the charge fixing film comprises two or more kinds of layers stacked together.

* * * * *